(12) United States Patent
Chen et al.

(10) Patent No.: US 12,463,152 B2
(45) Date of Patent: Nov. 4, 2025

(54) MULTI-CHANNEL DEVICE WITH SEAL RING STRUCTURE AND METHOD MAKING THE SAME

(71) Applicant: Taiwan Semiconductor Manufacturing Company, Ltd., Hsin-Chu (TW)

(72) Inventors: Chun Yu Chen, Hsinchu (TW); Yen Lian Lai, New Taipei (TW)

(73) Assignee: TAIWAN SEMICONDUCTOR MANUFACTURING COMPANY, LTD, Hsinchu (TW)

( * ) Notice: Subject to any disclaimer, the term of this patent is extended or adjusted under 35 U.S.C. 154(b) by 603 days.

(21) Appl. No.: 17/832,940

(22) Filed: Jun. 6, 2022

(65) Prior Publication Data

US 2023/0395533 A1   Dec. 7, 2023

(51) Int. Cl.
*H01L 23/58* (2006.01)
*H01L 23/00* (2006.01)
*H01L 23/48* (2006.01)
*H01L 25/065* (2023.01)
*H10D 30/62* (2025.01)

(52) U.S. Cl.
CPC .......... *H01L 23/585* (2013.01); *H01L 23/481* (2013.01); *H01L 23/562* (2013.01); *H01L 25/0657* (2013.01); *H10D 30/62* (2025.01)

(58) Field of Classification Search
CPC ............. H01L 233/585; H01L 233/481; H01L 233/562; H01L 25/0657; H10D 30/62; H10D 30/797; H10D 30/014; H10D 30/43; H10D 30/6735; H10D 30/6757; H10D 64/017; H10D 62/822; H10D 62/121
See application file for complete search history.

(56) References Cited

U.S. PATENT DOCUMENTS

| | | | |
|---|---|---|---|
| 8,125,054 B2 * | 2/2012 | West | H01L 23/585 438/106 |
| 8,796,666 B1 | 8/2014 | Huang et al. | |
| 8,815,712 B2 | 8/2014 | Wan et al. | |
| 8,836,016 B2 | 9/2014 | Wu et al. | |
| 8,841,701 B2 | 9/2014 | Lin et al. | |
| 8,847,293 B2 | 9/2014 | Lee et al. | |

(Continued)

FOREIGN PATENT DOCUMENTS

| | | |
|---|---|---|
| TW | 200707302 A | 2/2007 |
| TW | 200713397 A | 4/2007 |

(Continued)

*Primary Examiner* — Dao H Nguyen
(74) *Attorney, Agent, or Firm* — HAYNES AND BOONE, LLP

(57) ABSTRACT

The present disclosure provides a semiconductor structure that includes a substrate having a circuit region and a seal ring region around the circuit region; first active regions of a first width W1 formed in the circuit region; second active regions of a second width W2 formed in the seal ring region; first gate stacks disposed on the first active regions in the circuit region and extending to isolation features; and second gate stacks disposed on the second active regions in the seal ring region and completely landing on the second active regions. The second width is greater than the first width, and each of the second active regions is a continuous ring shape to enclose the circuit region.

20 Claims, 28 Drawing Sheets

(56) References Cited

U.S. PATENT DOCUMENTS

| | | | |
|---|---|---|---|
| 8,853,025 B2 | 10/2014 | Zhang et al. | |
| 8,962,400 B2 | 2/2015 | Tsai et al. | |
| 8,963,258 B2 | 2/2015 | Yu et al. | |
| 9,093,514 B2 | 7/2015 | Tsai et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,245,805 B2 | 1/2016 | Yeh et al. | |
| 9,520,482 B1 | 12/2016 | Chang et al. | |
| 9,548,303 B2 | 1/2017 | Lee et al. | |
| 9,576,814 B2 | 2/2017 | Wu et al. | |
| 10,121,755 B1 * | 11/2018 | Bhatkar | H01L 23/562 |
| 10,304,781 B2 * | 5/2019 | Baek | H01L 22/34 |
| 11,282,798 B2 * | 3/2022 | Lei | H01L 22/34 |
| 2009/0079039 A1 * | 3/2009 | Fujita | H01L 23/585 |
| | | | 257/E23.002 |
| 2010/0052060 A1 * | 3/2010 | Lai | H01L 27/08 |
| | | | 257/E21.598 |
| 2013/0285116 A1 | 10/2013 | Lochtefeld et al. | |

FOREIGN PATENT DOCUMENTS

| | | |
|---|---|---|
| TW | 201535729 A | 9/2015 |
| TW | 201624640 A | 7/2016 |
| TW | 202032728 A | 9/2020 |
| TW | 202211476 A | 3/2022 |

* cited by examiner

MULTI-CHANNEL DEVICE WITH SEAL RING STRUCTURE AND METHOD MAKING THE SAME

BACKGROUND

In semiconductor technologies, a semiconductor wafer is processed through various fabrication steps to form integrated circuits (IC). Typically, several circuits or IC dies are formed onto the same semiconductor wafer. The wafer is then diced to cut out the circuits formed thereon. To protect the circuits from moisture degradation, ionic contamination, and dicing processes, a seal ring is formed around each circuit die. This seal ring is formed during fabrication of the many layers that comprise the circuits, including the front-end-of-line (FEOL) processing, the middle-end-of-line (MEOL) processing, and back-end-of-line (BEOL) processing. The FEOL and MEOL include forming transistors, capacitors, diodes, and/or resistors onto the semiconductor substrate. The BEOL includes forming metal layer interconnects and vias that provide routing to the components of the FEOL.

Although existing seal ring structures and fabrication methods have been generally adequate for their intended purposes, improvements are desired. For example, the seal ring structure is not robust to provide protection to the circuit devices. For at least these reasons, improvements are needed to the seal ring structure and the method making the same to address those issues.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
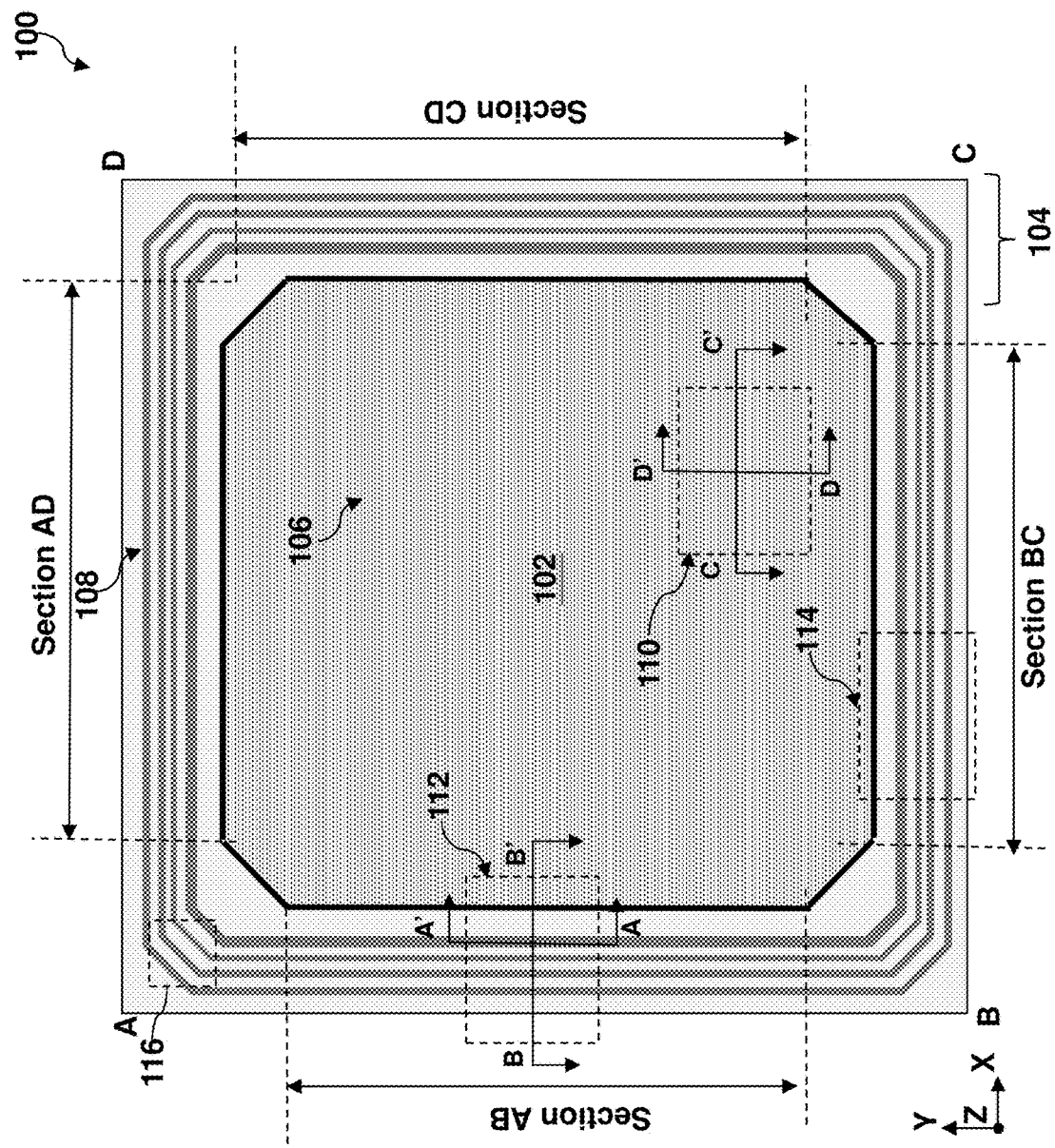
FIG. 1 is a top plan view of the semiconductor structure 100 according to the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

A semiconductor substrate, such as an integrated circuit chip includes a circuit region surrounded by a seal ring region. The seal ring region provides protection to the integrated circuit in the circuit region from various environment damage, such as moisture and chemical. The seal ring structure includes multiple layers vertically extending from the substrate, through an interconnect structure, and up to the passivation layer. The seal ring structure may be formed simultaneously with the circuit features in circuit area (or chip area, device area, chip die) through various fabrication stages, such as in the front-end-of-line (FEOL) structures, the middle-end-of-line (MEOL) structures, and/or in back-end-of-line (BEOL) structures. As used herein, FEOL structures include structural features of transistors or other semiconductor devices fabricated on a semiconductor substrate; MEOL structures include source/drain contact vias or gate contact vias; and BEOL structure include interconnect structures and passivation structures over the interconnect structures. In the BEOL processes, conductive lines or vias are formed in multiple metal layers stacked over the semiconductor substrate to connect various features in the circuit region. Simultaneously, conductive rings and via rings are formed in the seal ring region of each metal layer. However, the conductive rings and the via rings in the seal ring region do not provide electrical functions for the semiconductor structure as the conductive lines and vias in the device region do. Instead, the conductive rings and via rings in the seal ring region encloses and protects the circuit area from moisture, mechanical stress, or other defect-generating mechanism. The differences in functionality cause the seal ring region to have properties different from the circuit region, such as pattern sizes and/or pattern density. The differences in properties may cause processing issues such as over etching in etching processes and/or dishing in chemical mechanical planarization (CMP) processes, especially in a region between the seal ring region and the circuit region.

This application generally relates to a semiconductor structure and fabrication processes thereof, and more particularly to a seal ring region of the semiconductor structure and the fabrication processes thereof. The seal ring region includes various sub-regions configured differently in a same layer and varying differently through multiple layers, as described below in detail. The seal ring region of the semiconductor structure includes a sealing region and a transition region. The transition region separates the sealing region from the circuit region. The transition region does not serve as active electronic components. Instead, the transition region is designed to have proper properties (e.g., proper line widths, line pitches, and/or line pattern density) that helps buffering the differences between the circuit region and the seal ring region, thereby providing smooth transition from the circuit region to the seal region. The smooth transition alleviates process issues such as dishing during the subsequent CMP processes and/or uneven etching during the subsequent etching processes. Those of ordinary skill in the art should appreciate that they may readily use the present disclosure as a basis for designing or modifying other processes and structures for carrying out the same purposes and/or achieving the same advantages of the embodiments introduced herein.

FIG. 1 is a top plan view of the semiconductor structure 100 according to the present disclosure. The semiconductor structure 100 (such as a manufactured wafer or a part thereof) includes a circuit region (or device region, IC die, chip area) 102 and a seal ring region 104 that encloses the circuit region 102 from a top view. The seal ring structure in the seal ring region 104 is disposed over a substrate and formed in multiple metal layers stacked thereover and along z-direction as discussed in detail below. The seal ring region 104 has a rectangular or substantially rectangular periphery fully surrounding the circuit region 102. The four corners A, B, C, and D of the rectangular periphery are replaced by four sloped corner lines that connects the adjacent sections AB, BC, CD, and AD of the seal ring region 104.

The semiconductor structure 100 includes various feature layers vertically extending from the substrate, through the interconnect structure, and up to the passivation layer, in both the device structure within the circuit region 102 and the seal ring structure within the seal ring region 104. The seal ring structure in the seal ring region 104 has a ring geometry designed for better protection to the circuit devices in the circuit region 102. Particularly, the seal ring structure in the seal ring region 104 also includes active regions, gate stacks and other features designed differently from those in the circuit region 102 for better protection of the circuit devices in the circuit region 102. For example, the active regions 106 in the circuit region 102 are longitudinally oriented along the X-direction while the active regions 108 in the seal ring region 104 are longitudinally oriented along the seal ring with a ring shape. Specifically, the segments of the active regions 108 adjacent sections BC and AD of the seal ring region 104 are longitudinally oriented along the X-direction, and the segments of the active regions 108 adjacent sections AB and CD of the seal ring region 104 are longitudinally oriented along the Y-direction. Furthermore, the active regions 106 and 108 are designed differently in width, pitch, length and continuity. A window portion 110 of the circuit region 102, and various window portions 112, 114 and 116 of the seal ring region 104 are further illustrated in following figures and described in detail below.

FIGS. 2A, 2B, 2C and 2D are top views of the window portions 110, 112, 114 and 116 of the semiconductor structure 100, respectively, constructed in accordance with some embodiments. Only active regions 106, 108, and isolation features 118 are illustrated for simplicity. In the disclosed embodiments, the isolation features 118 are shallow trench isolation (STI) features. The active regions 106 and 108 are fin active regions extruded from the substrate such that the top surface of the fin active regions is above the top surface of the isolation features 118. The isolation features 118 are surrounding each of the active regions 106, 108 so that various active regions 106, 108 are separated and isolated from each other.

Figure 2B:
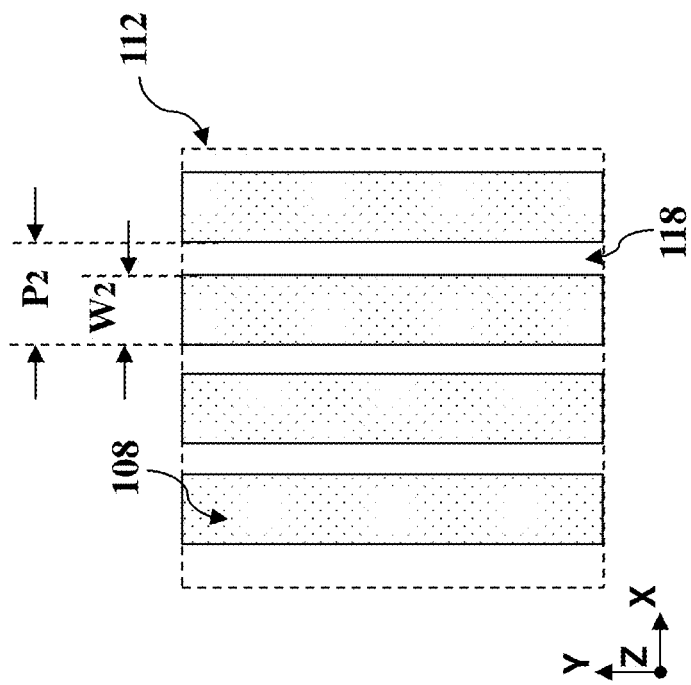
FIGS. 2A, 2B, 2C, 2D, 2E and 2F are top views of the window portions 110, 112, 114 and 116 of the semiconductor structure 100, respectively, constructed in accordance with some embodiment.
Figure 2A:
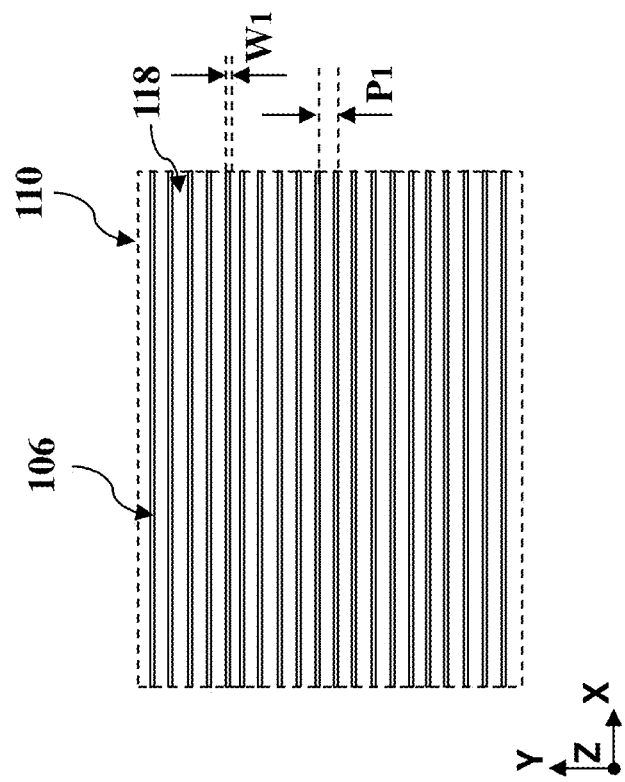
Figure 2D:
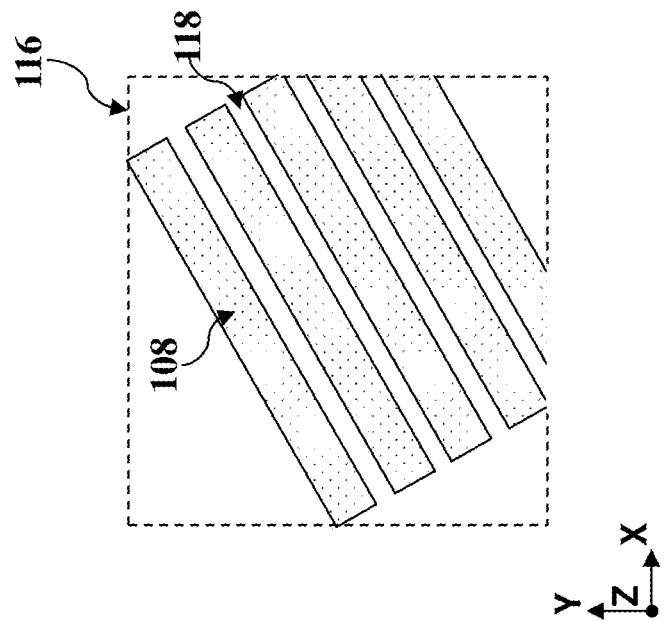
Figure 2C:
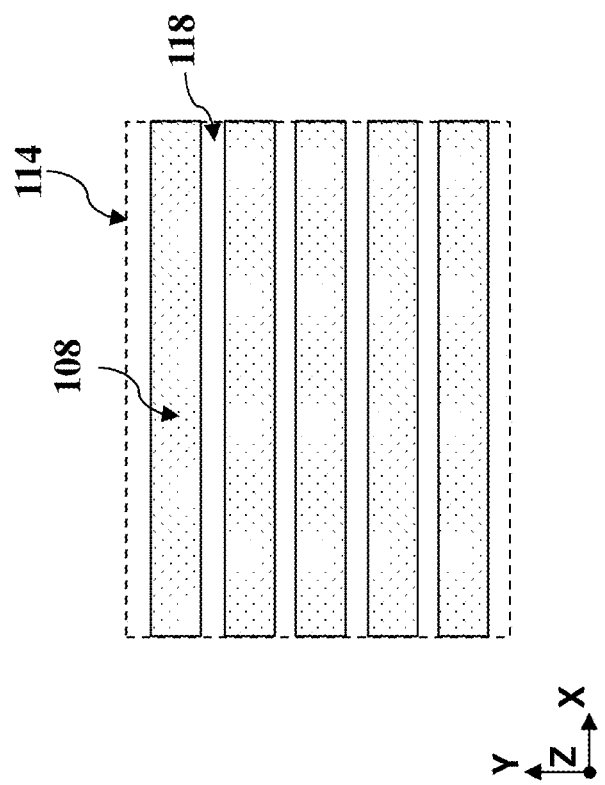

The active regions 106 in the circuit region 102 are longitudinally oriented along the same direction (the X-direction) and the active regions 108 in the seal ring region 104 are longitudinally oriented in different directions so that they form ring shape to provide protection of the circuit devices in the circuit region 102. The segments of the active regions 108 adjacent sections BC and AD of the seal ring region 104 are longitudinally oriented along the X-direction as illustrated in FIG. 2C; the segments of the active regions 108 adjacent sections AB and CD of the seal ring region 104 are longitudinally oriented along the Y-direction as illustrated in FIG. 2B; and the segments of the active regions 108 in the corners are longitudinally oriented in titled angles (e.g., 45° from the X-direction) such that the those segments are connected to adjacent segments to form continuous rings as illustrated in FIG. 2D.

The active regions 106 in the circuit region 102 have a first width (or referred to as line width) $W_1$ and the active regions 108 in the seal ring region 104 have a second width (or referred to as line width) $W_2$ different from the first width $W_1$. Particularly, line width $W_2$ is substantially greater than line width $W_1$. In some embodiments, a ratio $W_2/W_1$ ranges between 5 and 15. In some embodiments, line width $W_1$ ranges between 0.02 μm and 0.08 μm; and line width $W_2$ ranges between 0.1 μm and 0.4 μm.

The active regions 106 in the circuit region 102 have a first pitch (or referred to as pitch) $P_1$ and the active regions 108 in the seal ring region 104 have a second pitch (or referred to as pitch) $P_2$ different from the first pitch $P_1$. Particularly, pitch $P_2$ is substantially greater than pitch $P_1$. In some embodiments, a ratio $P_2/P_1$ ranges between 2 and 6. In some embodiments, pitch $P_1$ ranges between 0.05 μm and 0.2 μm; and pitch $P_2$ ranges between 0.2 μm and 0.8 μm.

Furthermore, the dimensional parameters, such as W2 and P2, may vary, depending on factors of fabrication requirement (such as pattern density uniformity) and device performance. For example, those variations may be used to tune pattern density to provide optimal environment to enhance the corresponding process (e.g., CMP or etching) and/or mechanical strength to reduce cracking issues, such as one illustrated in FIG. 2E, as a top view of the window portion 114 according to some embodiments. In this example, the width of the active regions 108 periodically vary from Wa to Wb, wherein Wb is less than Wa. For example, the ratio Wa/Wb ranges between 1.2 and 1.8. In various embodiments, the variation may be designed in random or periodic. The variation may be a combination of pitch variation and width variation. The width/pitch variation of ODs and gates in the seal-ring depend on process requirement (e.g., pattern density uniformity) to provide optimal environment for etching or CMP process.

Figure 2E:
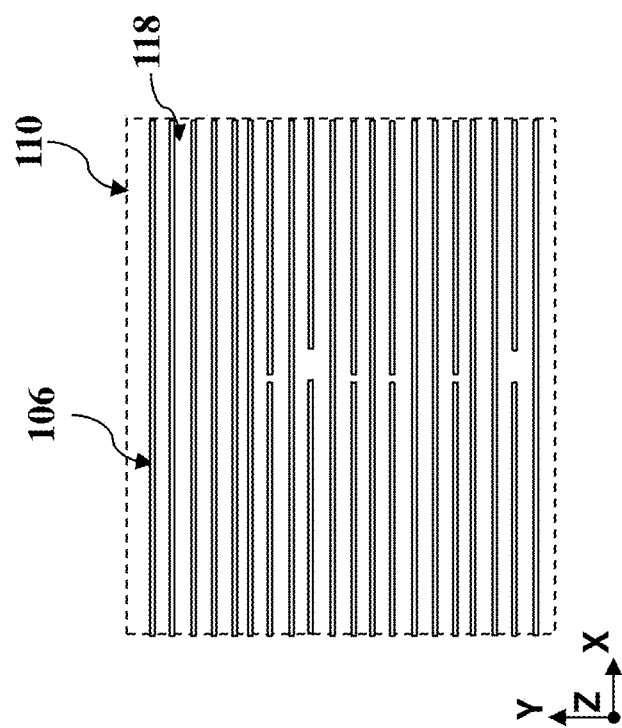
Figure 2F:
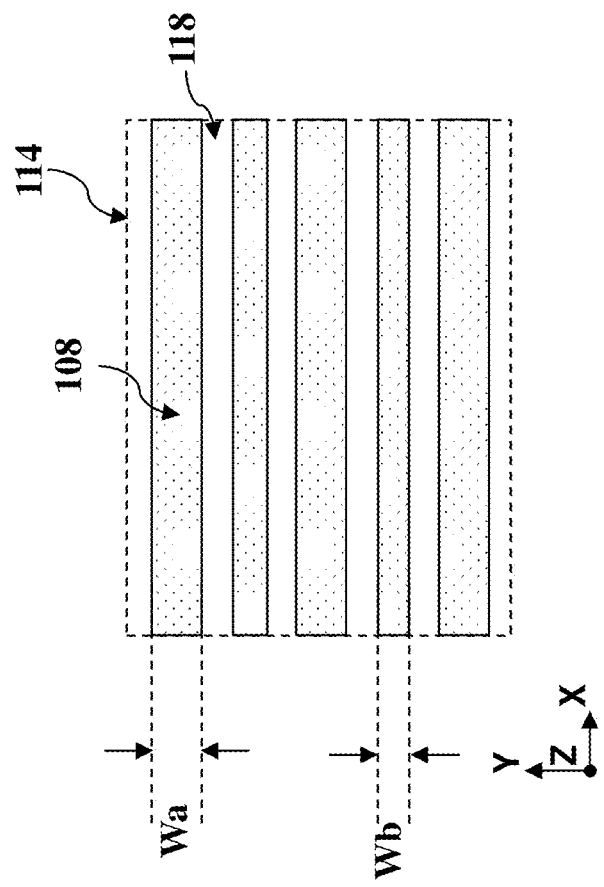

The active regions 108 in the seal ring region 104 are further different from the active regions 106 in the circuit region 102 in term of continuity. The active regions 106 in the circuit region 102 are not continuous and are segmented, depending on individual circuit and design layout, as illustrated in FIG. 2F. However, the active regions 108 in the seal ring region 104 are continuously extending around the circuit region 102, as illustrated in FIG. 1. FIG. 1 illustrates 4 active regions 108 in the seal ring region 104, each is continuously extending into a ring shape, such as extending from AB section, continuously extending to the corner B, continuously extending to BC section, continuously extending to the corner C, continuously extending to CD section, continuously extending to the corner D, and continuously extending to DA section, and continuously extending back to the corner A. It is noted that a number of active regions 108 in the seal ring region 104 is not limited to 4, and may include any proper number, depending on individual circuit and design.

With further reference to following figures, the semiconductor structure 100, particularly the seal ring structure in the seal ring region 104 is further described below in detail.

Figure 3B:
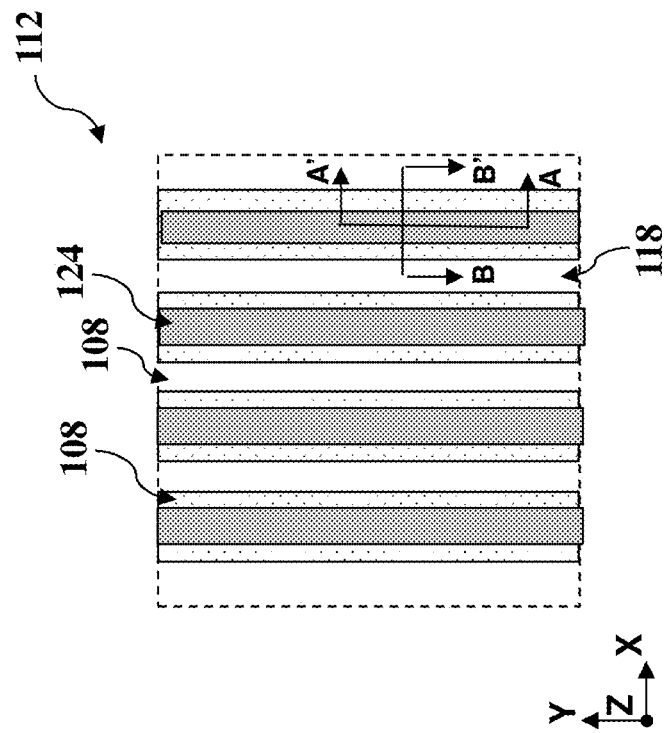
FIG. 3B is a top view of the semiconductor structure 100 in the window 112 of FIG. 1 constructed in accordance with some embodiments.
Figure 3A:
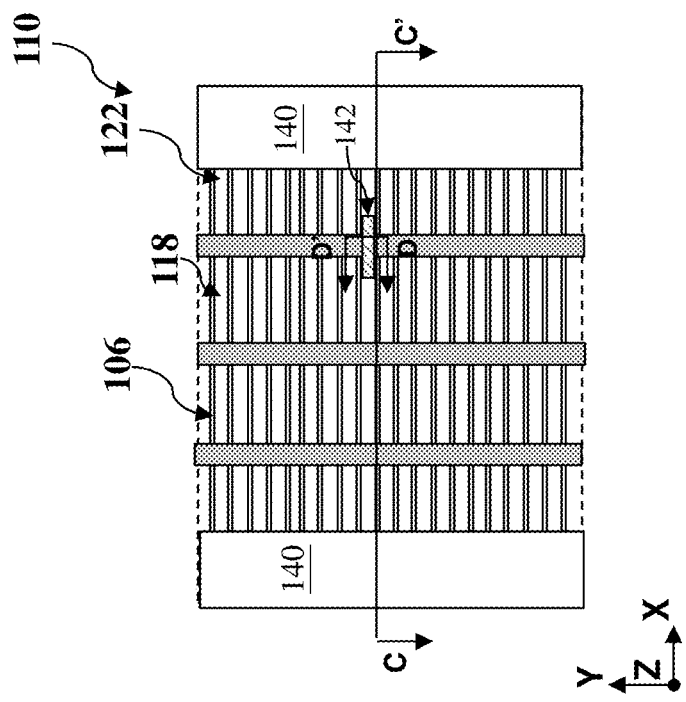
FIG. 3A is a top view of the semiconductor structure 100 in the window 110 of FIG. 1.

FIG. 3A is a top view of the semiconductor structure 100 in the window 110 of FIG. 1; and FIG. 3B is a top view of the semiconductor structure 100 in the window 112 of FIG. 1 constructed in accordance with some embodiments. FIG. 3A is similar to FIG. 2A but with gate stacks 122 included, and FIG. 3B is similar to FIG. 2B but with gate stacks 124 included. Furthermore, various cut features, such as active region cut features 140 and gate cut features 142, are also formed and illustrated. The active region cut features 140 are dielectric features formed to separate long active regions during double patterning process or multiple patterning process. For examples, the active regions are first formed in the first patterning process and the second patterning process cut the long active regions into short active regions according to design layout. In this case, the cut process includes forming a patterned resist layer by lithography process, etching to form trenches that cut the active regions, depositing dielectric material to fill the trenches, and may further apply a CMP process to remove the excessive dielectric material. Similarly, the gate cut features 142 have similar function to the gate stacks and are formed by the similar method.

In the disclosed embodiment, the gate stacks 122 in the circuit region 102 are longitudinally oriented in the Y-direction, which is orthogonal to the orientation (X-direction) of the active region 106 in the circuit region 102. In contrary, the gate stacks 124 in the seal ring region 104 are longitudinally oriented in the Y-direction, which is in parallel with the orientation (Y-direction) of the active region 108 in the seal ring region 104. Furthermore, the gate stacks 124 are completely landing on the respective active regions 108. For example, the gate stacks 124 are landing on the center of the active regions 108 with margins on both sides, such as equal margin on both sides. In this case, the width Wg of the gate stacks 124 is less than the width Wa of the active regions 108. In some embodiments, the ratio Wa/Wg ranges between 1.5 and 2. Such configuration of the gate stacks 124 and active regions 108 in the seal ring region 104 make the sealing structure more robust. The continuity from the active region 108 to the gate stack 124 provide better sealing effect. In the present embodiments, the gate stacks 122 and 124 are simultaneously formed with same compositions, such as by gate replacement. For example, the gate stacks (122 and 124) include a gate dielectric layer (such as an interfacial layer and a high-k dielectric material layer) and a gate electrode (such as metal materials that further include a work function metal layer and a fill metal layer).

Figure 4B:
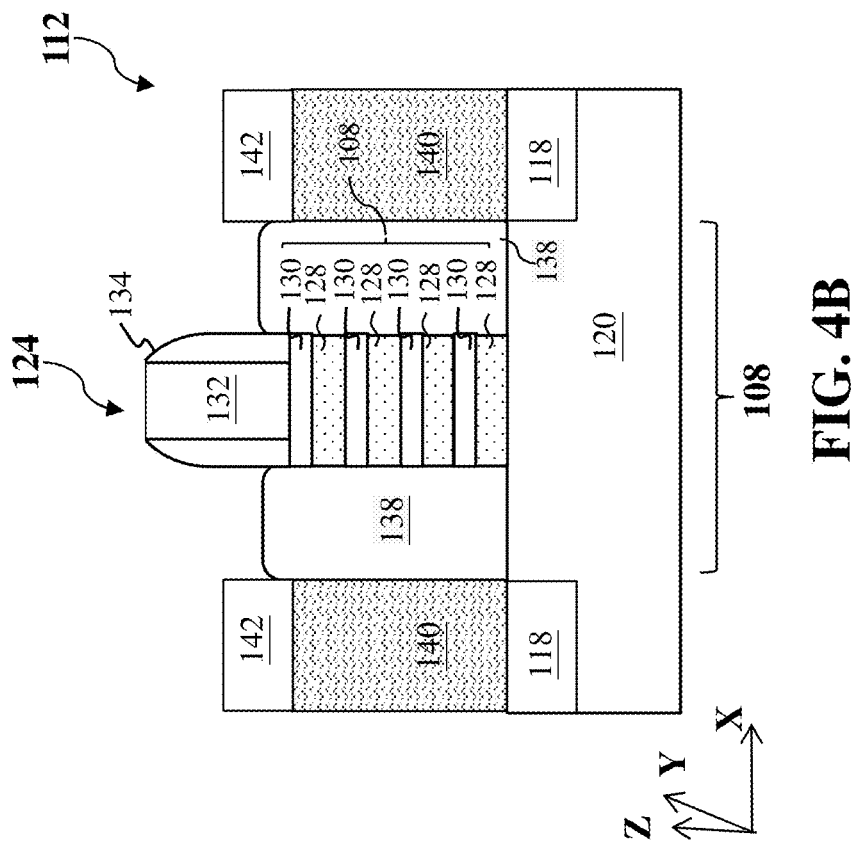
FIGS. 4B and 4F are sectional views of the semiconductor structure in the window 112 of FIG. 1 cut along line BB' of FIG. 1 or FIG. 3B.
Figure 4A:
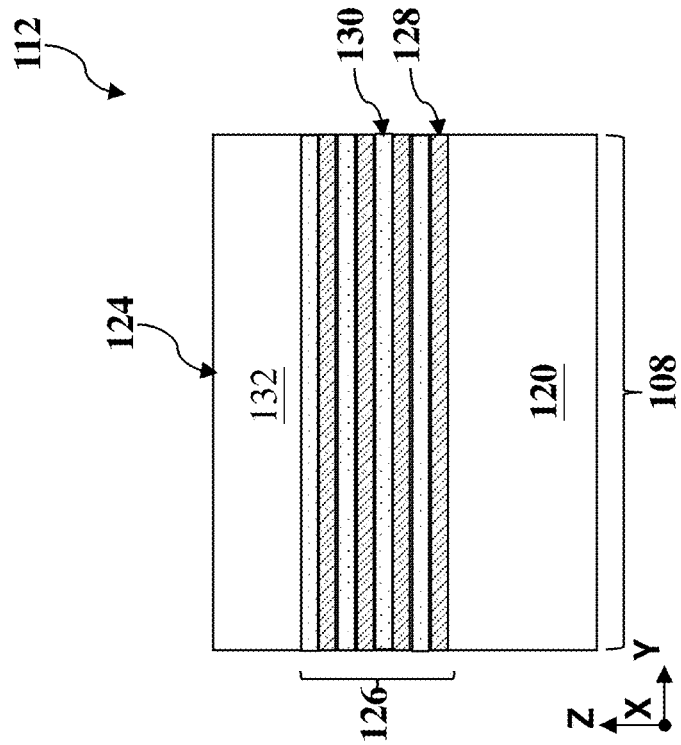
FIGS. 4A, 4E, 4H and 4I are sectional views of the semiconductor structure in the window 112 of FIG. 1 cut along line AA' of FIG. 1 or FIG. 3B.
Figures 4C, 4D:
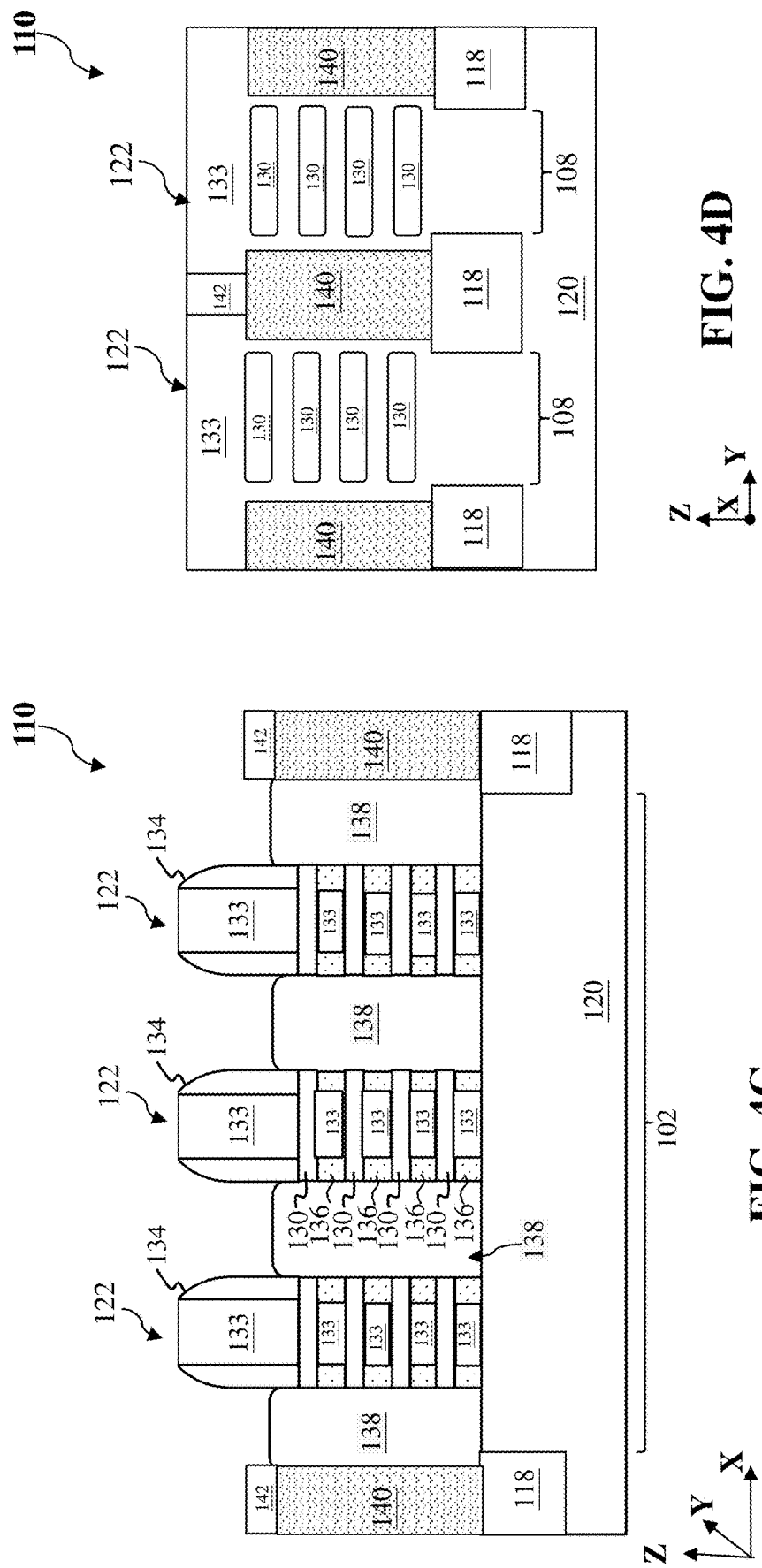
FIG. 4C is a sectional view of the semiconductor structure in the window 110 of FIG. 1 cut along line CC' of FIG. 1 or FIG. 3A.
FIGS. 4D and 4G are sectional views of the semiconductor structure in the window 110 of FIG. 1 cut along line DD' of FIG. 1 or FIG. 3A, constructed in accordance with some embodiments.

FIG. 4A is a sectional view of the semiconductor structure 100 in the window 112 of FIG. 1 cut along line AA' of FIG. 1 or FIG. 3B; FIG. 4B is a sectional view of the semiconductor structure 100 in the window 112 of FIG. 1 cut along line BB' of FIG. 1 or FIG. 3B; FIG. 4C is a sectional view of the semiconductor structure 100 in the window 110 of FIG. 1 cut along line CC' of FIG. 1 or FIG. 3A; and FIG. 4D is a sectional view of the semiconductor structure 100 in the window 110 of FIG. 1 cut along line DD' of FIG. 1 or FIG. 3A, constructed in accordance with some embodiments. Note that only substrate, active regions, isolation features and gate stacks are illustrated in those figures. Other features, such as interconnect structure and passivation layer are to be described later.

In FIG. 4A, the semiconductor layer stack 126 is formed on a substrate 120. In the depicted embodiment, substrate 120 includes silicon. Additionally or alternatively, substrate 120 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 120 is a semiconductor-on-insulator substrate, such as a silicon-on-insulator (SOI) substrate, a silicon germanium-on-insulator (SGOI) substrate, or a germanium-on-insulator (GOI) substrate.

Semiconductor-on-insulator substrates can be fabricated using separation by implantation of oxygen (SIMOX), wafer bonding, and/or other suitable methods. Substrate 120 can include various doped regions depending on design requirements of the semiconductor structure 100. In the depicted embodiment, substrate 120 includes various doped features, such as a p-type doped region (referred to hereinafter as a p-well), which can be configured for n-type gate-all-around (GAA) transistors, and an n-type doped region (referred to hereinafter as an n-well), which can be configured for p-type GAA transistors. N-type doped regions are doped with n-type dopants, such as phosphorus, arsenic, other n-type dopant, or combinations thereof. P-type doped regions are doped with p-type dopants, such as boron, indium, other p-type dopant, or combinations thereof. In some implementations, substrate 120 includes doped regions formed with a combination of p-type dopants and n-type dopants. The various doped regions can be formed directly on and/or in substrate 120, for example, providing a p-well structure, an n-well structure, a dual-well structure, a raised structure, or combinations thereof. An ion implantation process, a diffusion process, and/or other suitable doping process can be performed to form the various doped regions.

A semiconductor layer stack 126 is formed over substrate 120, semiconductor layer stack 126 is patterned to form active regions, such as 108, and the gate stack 124 is formed on the active region 108. Semiconductor layer stack 126 includes semiconductor layers 128 and semiconductor layers 130 stacked vertically (e.g., along the z-direction) in an interleaving or alternating configuration from a surface of substrate 120. In some embodiments, semiconductor layers 128 and semiconductor layers 130 are epitaxially grown in the depicted interleaving and alternating configuration. For example, a first one of semiconductor layers 128 is epitaxially grown on substrate, a first one of semiconductor layers 130 is epitaxially grown on the first one of semiconductor layers 128, a second one of semiconductor layers 128 is epitaxially grown on the first one of semiconductor layers 130, and so on until semiconductor layers stack 126 has a desired number of semiconductor layers 128 and semiconductor layers 130. In such embodiments, semiconductor layers 128 and semiconductor layers 130 can be referred to as epitaxial layers. In some embodiments, epitaxial growth of semiconductor layers 128 and semiconductor layers 130 is achieved by a molecular beam epitaxy (MBE) process, a chemical vapor deposition (CVD) process, a metalorganic chemical vapor deposition (MOCVD) process, other suitable epitaxial growth process, or combinations thereof.

A composition of semiconductor layers 128 is different than a composition of semiconductor layers 130 to achieve etching selectivity and/or different oxidation rates during subsequent processing. In some embodiments, semiconductor layers 128 have a first etch rate to an etchant and semiconductor layers 130 have a second etch rate to the etchant, where the second etch rate is less than the first etch rate. In some embodiments, semiconductor layers 128 have a first oxidation rate and semiconductor layers 130 have a second oxidation rate, where the second oxidation rate is less than the first oxidation rate. In the depicted embodiment, semiconductor layers 128 and semiconductor layers 130 include different materials, constituent atomic percentages, constituent weight percentages, thicknesses, and/or characteristics to achieve desired etching selectivity during an etching process, such as an etching process implemented to form suspended channel layers in channel regions of semiconductor structure 100. For example, where semiconductor layers 128 include silicon germanium and semiconductor layers 130 include silicon, a silicon etch rate of semiconductor layers 130 is less than a silicon germanium etch rate of semiconductor layers 128 in the etching process of the channel-release. In some embodiments, semiconductor layers 128 and semiconductor layers 130 can include the same material but with different constituent atomic percentages to achieve the etching selectivity and/or different oxidation rates. For example, semiconductor layers 128 and semiconductor layers 130 can include silicon germanium, where semiconductor layers 128 have a first silicon atomic percent and/or a first germanium atomic percent and semiconductor layers 130 have a second, different silicon atomic percent and/or a second, different germanium atomic percent. The present disclosure contemplates that semiconductor layers 128 and semiconductor layers 130 include any combination of semiconductor materials that can provide desired etching selectivity, desired oxidation rate differences, and/or desired performance characteristics (e.g., materials that maximize current flow), including any of the semiconductor materials disclosed herein.

In FIG. 4B, the gate stack 124, source and drain (collectively source/drain features) 138 are formed in the seal ring region 104. Note that only one active region 108 is illustrated in FIG. 4B and it is not intending to be limiting. The number of the active regions 108 in the seal ring region 104 can be any proper number, depending on the design consideration, sealing effect and other factors. In the disclosed structure, the first semiconductor layers 128 are removed with the second semiconductor layers 130 remained as channels (also referred to by numeral 130), the multiple channels 130 are vertically stacked over the substrate 120 and are connected to the source/drain features 138. The gate stack 124 includes one or more gate material referred by numeral 132. The gate stack 124 may include a gate dielectric layer and a gate electrode. In some embodiments, the gate material 132 includes polysilicon.

Gate spacers 134 are disposed on sidewalls of the gate stack 124. The gate spacers 134 include one or more dielectric material, such as silicon oxide, silicon nitride, silicon oxynitride or a combination thereof. The gate stack 124 is disposed on the semiconductor layer stack 126. In this case, the structure of the active region and gate stack in the seal ring region 104 is different from those in the circuit region 102 since the circuit region 102 includes GAA transistors, the first semiconductor layers 128 are removed to release channels, and the gate stack is extending down to wrap around the vertically stacked channels, which will be further described below. The seal ring structure in the seal ring region 104 may also include various cut features, such as active region cut features 140 and gate cut features 142, formed during double or multiple patterning processes. In some embodiments, the active region cut features 140 are dielectric features or a subset thereof are dielectric fins (relative to fin active regions) configured to tune pattern density and pattern uniformity to enhance to fabrication, such as CMP processes. The source and drain (or source/drain features) 138 are formed on the active region 108 contacting both the first semiconductor layers 128 and the second semiconductor layers 130.

Figure 4F:
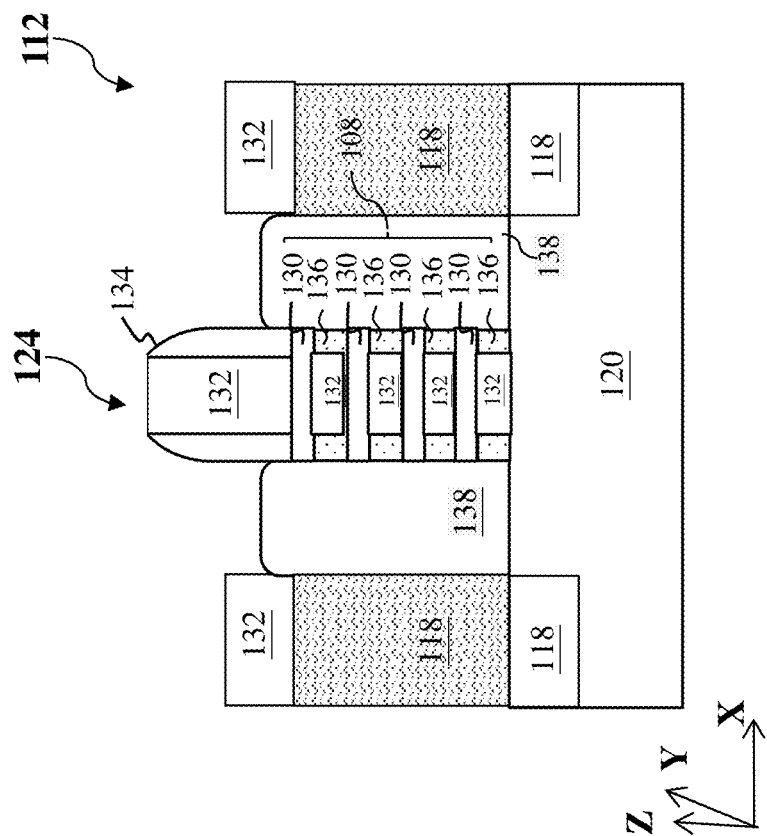
Figure 4E:
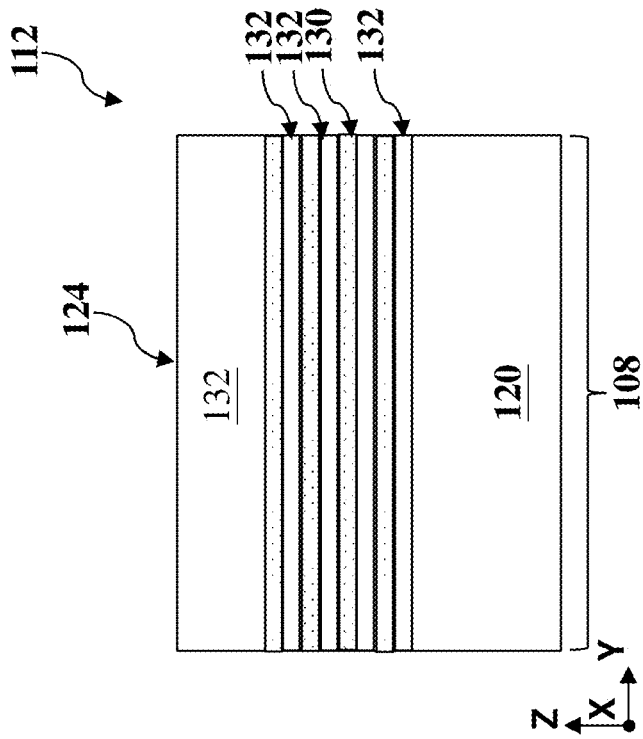

In FIGS. 4C and 4D, the circuit region 102 includes multi-channel devices, such as GAA transistors, are formed on the substrate 120. Multi-channel device includes multiple channels vertically stacked on the substrate 120 and a gate stack 122 extends to wrap around of and couple with each of the vertically stacked multiple channels. The source and drain 138 are disposed on opposite sides of the gate stack 122 and connect each of the vertically stacked multiple channels 130. In the disclosed embodiment, the first semiconductor layers 128 are removed to release channels, the second semiconductor layers 130 function as channels of multi-channel transistors. The gate stack 122 includes a gate dielectric layer and a gate electrode, collectively referred to as gate materials by numeral 133. Note that the gate materials 133 may be different from the gate material 132 according to some embodiments. For example, the gate materials 133 include a gate dielectric layer (that further includes a high-k dielectric material) and a gate electrode (that further includes metal). The gate stack 122 is extending to wrap around each of the channels 130. The source/drain features 138 are isolated from the gate stack 122 by inner spacers 136 and the gate spacers 134. The inner spacers 136 include one or more dielectric material, such as silicon oxide, silicon nitride, silicon oxynitride or a combination thereof. The formation of the disclosed structure includes forming dummy gates by depositing (such as polysilicon) and patterning; forming source/drain features by etching to recess source/drain regions, laterally recessing the first semiconductor layers 128, forming inner spacers 136 by deposition and anisotropic etching, and epitaxial growth to form source/drain features 138; forming interlayer dielectric (ILD) layer; removing the dummy gates by selective etching; selectively removing the first semiconductor layers 128 to release the channels; and forming metal gates to wrap around the channels by deposition. The subset of the above operations to form gate stacks 122 is referred to as gate replacement. The replaced gate stacks 122 includes high-k dielectric material and metal. Back to FIGS. 4A and 4B, since gate stack 124 are not formed by the gate replacement, the gate materials of the gate stacks 124 are different from the gate material of the gate stacks 122. For example, the gate stacks 124 include polysilicon. In some embodiments, the gate stacks in the seal ring region 104 are partially replaced, such as only the dummy gates are replaced but the first semiconductor layers 128 are not removed and the channels are not released in the seal ring region 104. In this case, the gate stacks 124 have the same composition as the gate stack 122 but different configuration, as illustrated in FIGS. 4A, 4B, 4C and 4D. In some embodiments, the gate stacks 124 in the seal ring region 104 are similarly formed as the gate stack 122 in the circuit region 102. Particularly, the dummy gates are replaced and the first semiconductor layers 128 are removed and the channels are released in the seal ring region 104, as illustrated in FIGS. 4E and 4F. In some embodiments, the gate cut features may be formed before the dummy gates, after the dummy gates or after the gate replacement. In the above-described various embodiments, the gate stacks 124 are either formed by the gate replacement or alternatively formed without gate replacement, various parameters of the seal ring structure, such as width and pitch of active regions 108, may vary randomly or periodically or vary according to other consideration, such as illustrated in FIG. 2E.

Figure 4G:
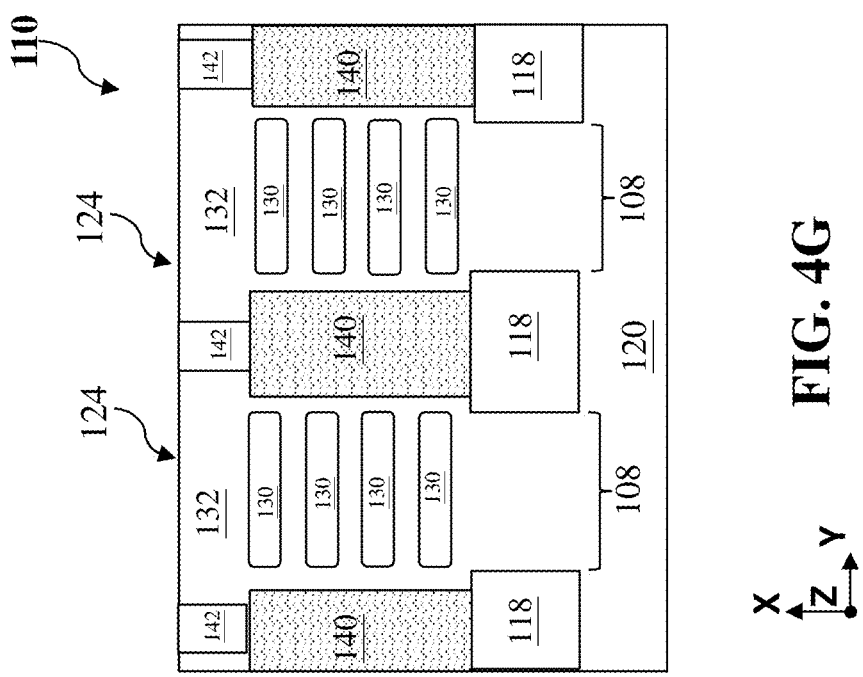

In other embodiments, the gate cut features 142 may be configured differently in the circuit region 102, such as illustrated in FIG. 4G. FIG. 4G is similar to FIG. 4D except for that the gate cut features 142 are configured differently. In the disclosed embodiment, the gate cut features 142 are formed on various fin cut features 140. The gate stack 124 is cut into multiple segments.

Figure 4I:
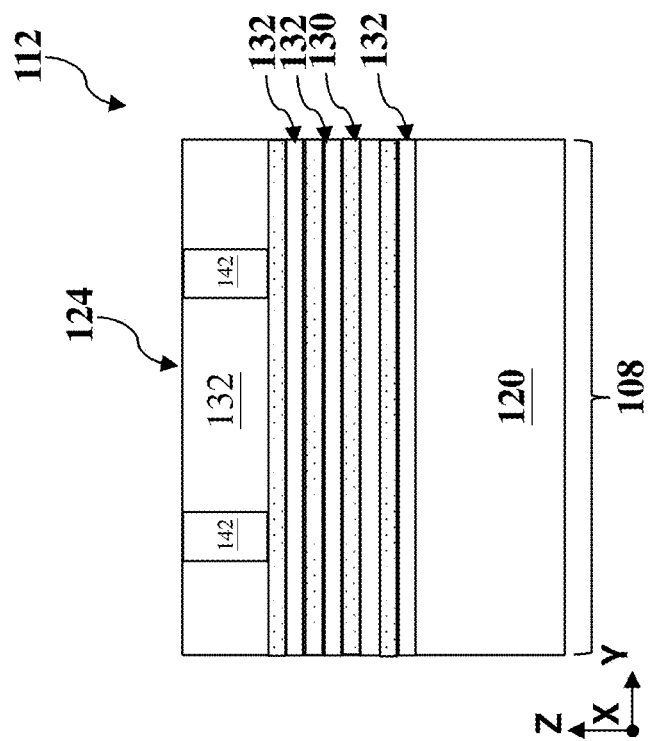
Figure 4H:
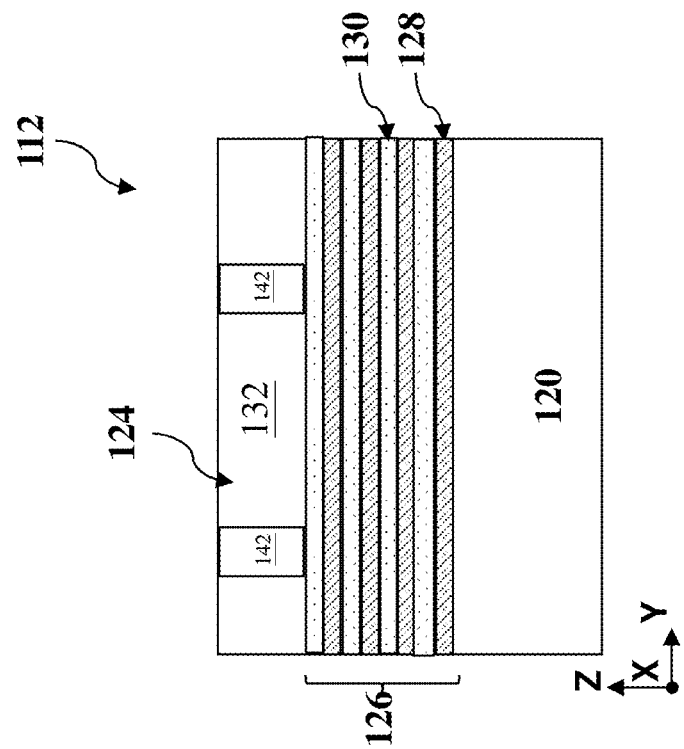

In other embodiments, the gate cut features 142 may be configured differently in the seal ring region 104, such as illustrated in FIGS. 4H and 4I. FIG. 4H is similar to FIG. 4A except for that the gate cut features 142 are configured differently. FIG. 4I is similar to FIG. 4E except for that the gate cut features 142 are configured differently.

The semiconductor structure 100 in various embodiments may be formed with other technologies, such as system on chip (SoC), integrated fan out (InFO) packaging technologies, package-on-package (POP), Chip-on-Wafer-on-Substrate (CoWoS), and other suitable structure/technology.

As described before, after formation of active regions, channels, source/drain features and gate stacks, interconnect structure and passivation layer are further formed thereon. Various features in the seal ring region 104 are also designed differently from those in the circuit region 102 as further described below in detail.

Figure 5:
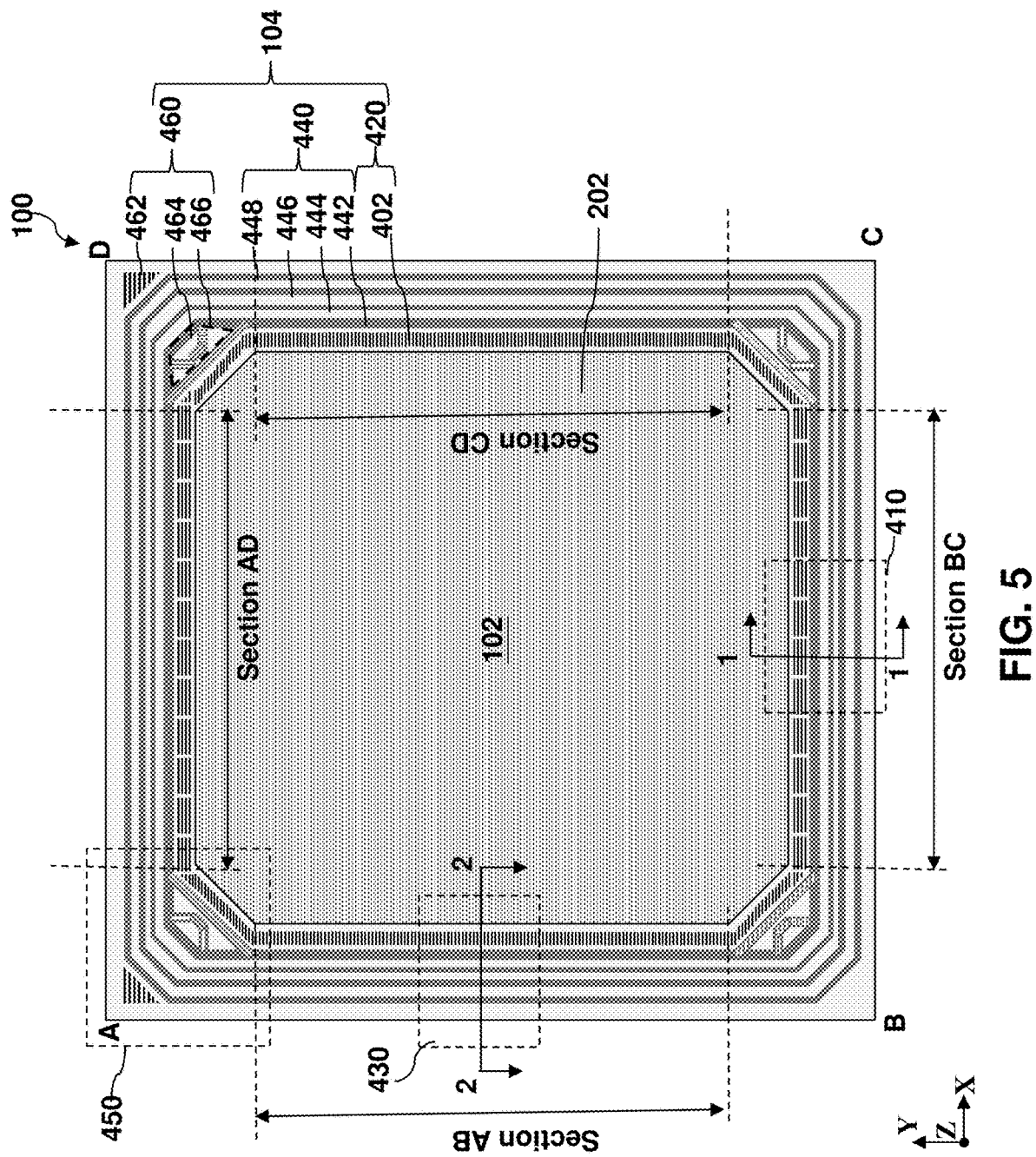
FIG. 5 is a top plan view of a semiconductor structure with a seal ring region according to various aspects of the present disclosure.

Referring to FIG. 5, in the present embodiment, the seal ring region 104 includes transition region 420, sealing region 440, and four corner regions 460.

The sealing region 440 may include multiple concentric seal rings. In the present embodiments, the sealing region 440 includes concentric seal rings 442, 444, 446, and 448 disposed substantially parallel to each other, each of which extends fully around and completely encloses the circuit region 102. The seal ring 442 encloses the circuit region 102, the seal ring 444 encloses the seal ring 442, the seal ring 446 encloses the seal ring 444, and the seal ring 448 encloses the seal ring 446. The nested seal rings 442, 444, 446, and 448 protect the circuit region 102 from damages such as dust, moisture, mechanical stress, and/or other degradation mechanisms. Each of the seal rings 442, 444, 446, and 448 includes conductive lines and vias disposed in each of the metal layers stacked over the substrate. The conductive lines and vias may each include copper (Cu), titanium nitride (TiN), tungsten (W), ruthenium (Ru), other suitable conductive material or a combination thereof.

The transition region 420 is disposed between the sealing region 440 and the circuit region 102. The transition region 420 includes transition lines 402 parallel to each other and distributed around the entire circuit region 102. The transition lines 402 may each include copper (Cu), titanium nitride (TiN), tungsten (W), ruthenium (Ru), other suitable conductive material or a combination thereof. The circuit region 102 and the sealing region 440 have different properties although they may have similar components (fins, gates, epitaxial features, conductive lines etc.), such as sizes of the components, pattern density, line width, line pitch, and/or other properties. The differences in properties may lead to processing issues such as dishing in subsequent CMP processes and over etching in subsequent etching processes. To solve or improve such issues, the properties of the transition region 420, such as line width, line pitch, and/or pattern density, are designed to be greater than their counterparts in the circuit region but less than their counterparts in the seal ring region.

Each of the four corner regions 460 is disposed adjacent to the corresponding sloped corner lines of the seal ring region 104. The sealing region 440 divide the corner regions 460 into outer corner regions 462 outside the sealing region 440 and the inner corner regions 464 and 466 inside the sealing region 440. The outer corner regions 462 and the inner corner regions 464 and 466 provide further mechanical strength for the seal ring region 104. The corner regions 460 may include various conductive lines as discussed in detail below in accordance with FIGS. 11A, 11B, 16, and 17.

The circuit region 102 includes conducive lines 202 in the BEOL structures. In the present embodiments, the conductive lines 202 are straight parallel lines disposed lengthwise along x direction. The conductive lines 202 may be disposed lengthwise along y direction in alternative embodiments as discussed in detail with respect to FIGS. 14-17. The exact functionality and/or configuration of the circuit region 102 is not limited by the present disclosure.

In the disclosed embodiment, the conductive lines 202 in the circuit region 102 are portions of the interconnect structure. The interconnect structure includes metal lines distributed in a plurality of metal layers, vias disposed between the adjacent metal layers to provide vertical routing.

Seal rings and transition lines are conductive features and are vertically extending from the substrate, through the interconnect structure, and up to the passivation layer. However, conductive lines 202 in the circuit region 102, transition lines 402 in the transition region 420, and seal rings (such as 442, 444, 446 and 448) in the sealing regions 440 are designed differently. For example, the conductive lines 202 in the circuit region 102 in the $n^{th}$ metal layer $M_n$ and the conductive lines 202 in the $(n+1)^{th}$ metal layer $M_{(n+1)}$ are substantially perpendicular. The transition lines 402 in the $n^{th}$ metal layer $M_n$ are oriented in parallel with the conductive lines 202 in the $n^{th}$ metal layer $M_n$; and the transition lines 402 in the $(n+1)^{th}$ metal layer $M_{(n+1)}$ are oriented in parallel with the conductive lines 202 in the $(n+1)^{th}$ metal layer $M_{(n+1)}$ to provide proper transition from the circuit region 102 to the seal ring region 104. In contrast, the seal rings (such as 442, 444, 446 and 448) maintain their orientations through various metal layers and are in parallel with the adjacent edge of the chip. For example, the segments of the seal rings associated with the chip edge AB are in parallel with the chip edge AB, the segments of the seal rings associated with the chip edge BC are in parallel with the chip edge BC, and so on.

Figure 6:
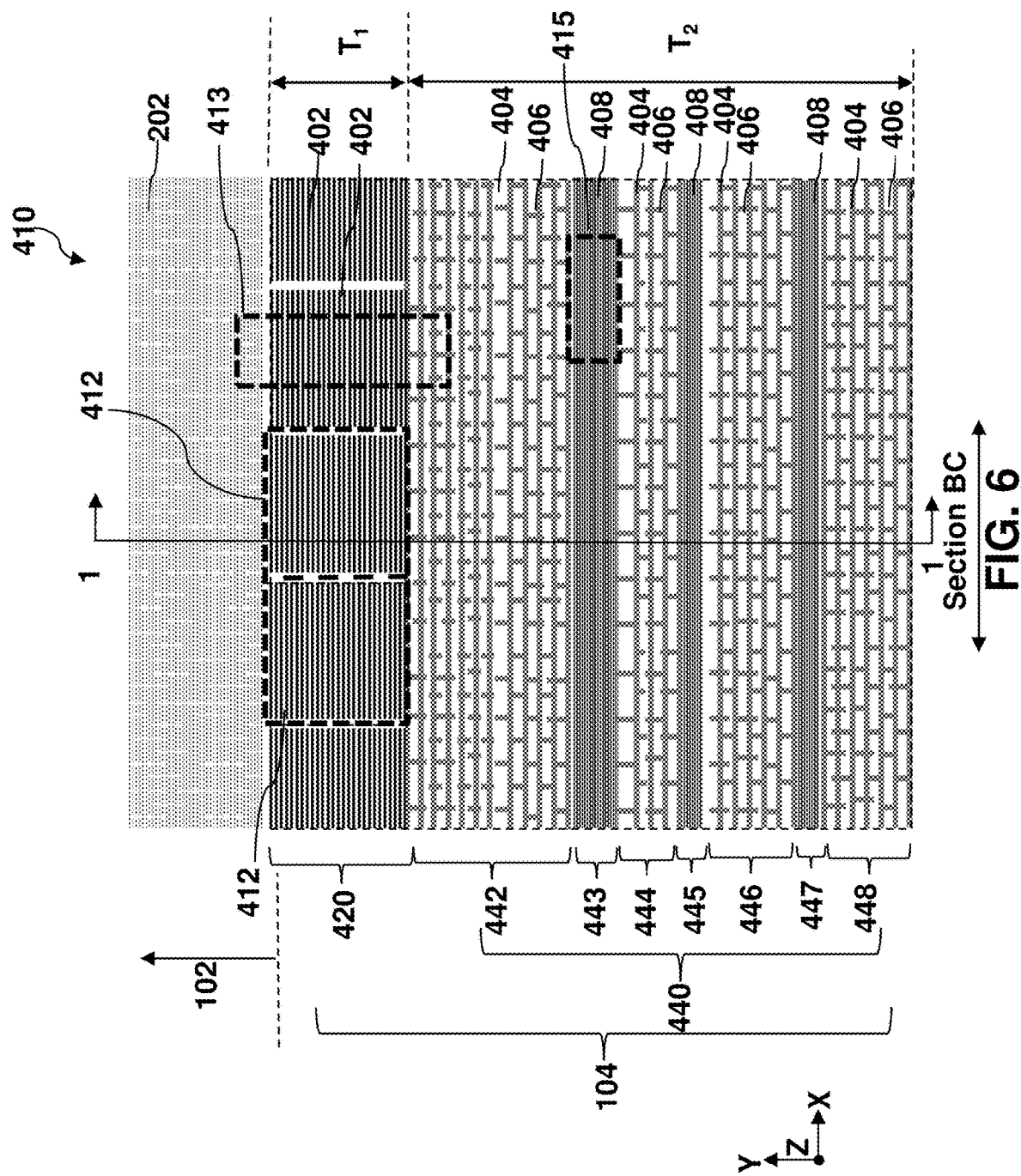
FIGS. 6 and 14 are enlarged top plan views of area 410 in FIG. 5, according to various aspects of the present disclosure.

FIG. 6 is an enlarged top plan view of the area 410 shown in FIG. 5. The area 410 is selected from the section BC of the seal ring region 104 for illustration purposes. The same principles apply to the section AD equally except that the section AD is a mirrored image of the section BC along a center line of the semiconductor structure 100 along x direction. The seal rings 442, 444, 446, and 448 in section BC of the seal ring region 104 lengthwise extend along x direction. Each of the seal rings 442, 444, 446, and 448 includes conductive rings (or metal rings) 404 disposed lengthwise along x direction in the section BC. The metal rings 404 are connected by the conductive bars (or metal bars) 406 disposed lengthwise along y direction between the metal rings 404. The interconnected metal rings 404 and conductive bars 406 increases the mechanical strength of the seal rings 442, 444, 446, and 448. The seal rings 442, 444, 446, and 448 are separated from each other by seal ring gap regions (SRG regions) 443, 445 and 447 so that the outer seal rings can stop the propagation of cracking and thus protect inner seal rings. For example, in the case that the outer seal ring 448 is damaged by cracking, the seal ring gap region between the seal ring 448 and the seal ring 446 can prevent the crack from propagating to the seal rings 446, 444, and 442. Therefore, leaving the inner seal rings 446, 444, and 442 intact to protect the circuit region 102. In the present embodiments, the seal ring region 104 further includes metal rings 408 (also be referred to as property enhancing rings (PERs) 408) disposed in the SRG regions 443, 445 and 447 between the seal rings 442, 444, 446, and 448. The PERs are further discussed in detail, such as in FIG. 7C.

The transition region 420 is disposed between the sealing region 440 and the circuit region 102. A thickness $T_1$ of the transition region 420 is different from (e.g., less than) a thickness $T_2$ of the sealing region 440. The thicknesses $T_1$ and $T_2$ are measured along a direction substantially perpendicular to the lengthwise direction of the seal ring. In one example, the thickness $T_1$ is about 25% to 50% of the thickness $T_2$. The thickness $T_1$ is proportional to the property (e.g., pattern density) differences between the sealing region 440 and the circuit region 102. For example, the greater the differences, the greater the thickness $T_1$ is needed to transit between the sealing region 440 to the circuit region 102 to avoid processing issues.

Figure 7A:
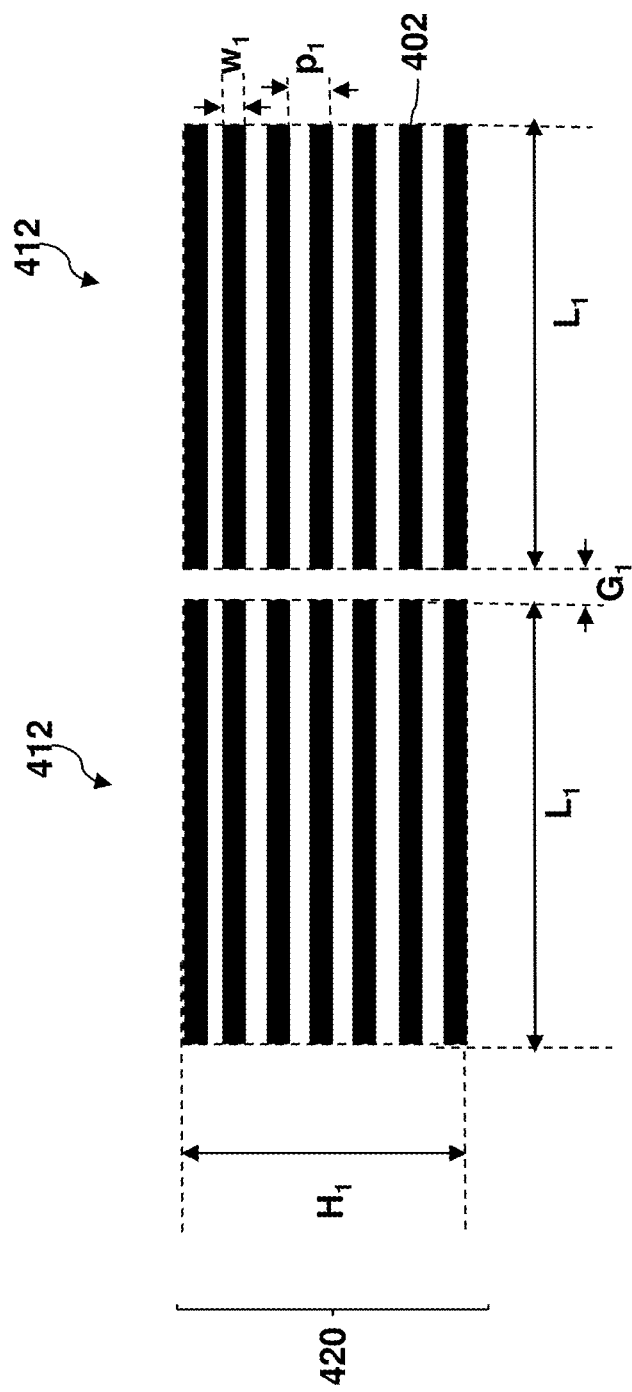
FIGS. 7A and 7B are enlarged top plan views of area 412 in FIG. 6, according to various embodiments of the present disclosure.
Figure 7B:
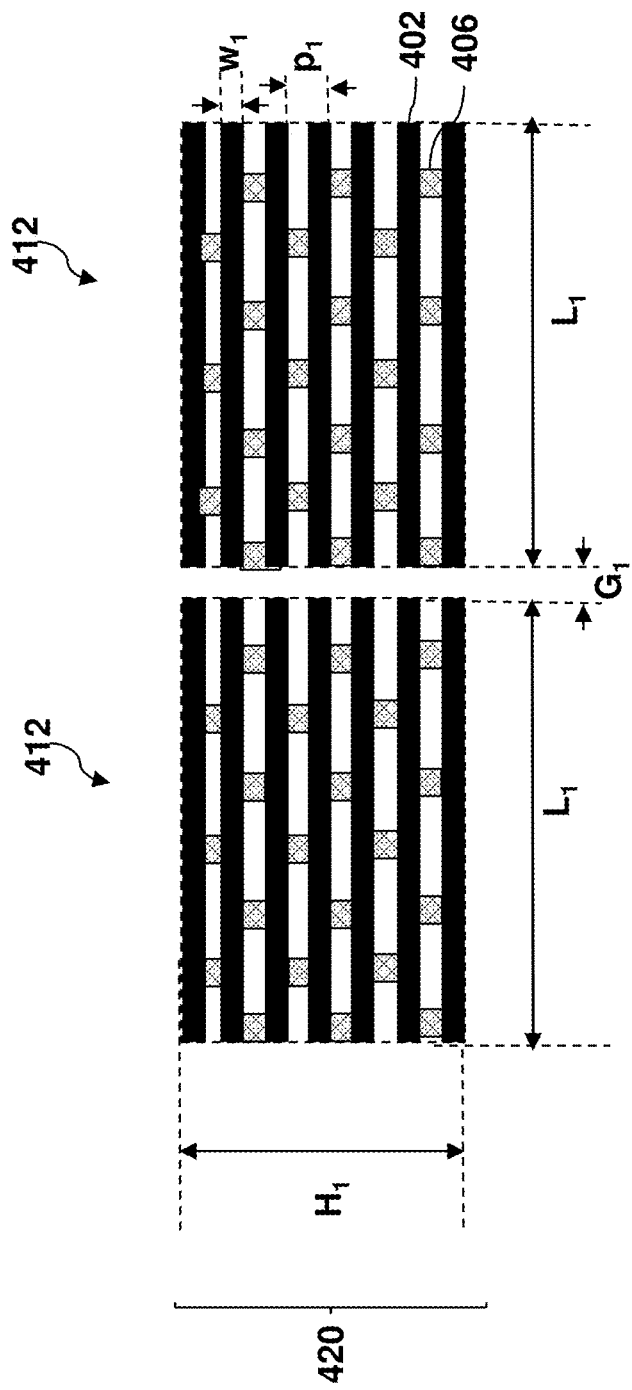

FIGS. 7A and 7B are enlarged top plan views of rectangular areas (or rectangular units) 412 in FIG. 6, according to various embodiments of the present disclosure. Referring to FIG. 7A, the transition region 420 includes transition lines 402 disposed in rectangular areas 412 in the section BC of the seal ring region 104. The rectangular units 412 may have various sizes and various length to width ratios, designed to enhance fabrication and circuit performance. In the present embodiments, the rectangular units 412 have a uniform size and a uniform length to width ratio in the section BC of the seal ring region 104. The uniform size and the uniform length to width ratio are defined by a length $L_1$ and a height $H_1$ as shown in FIG. 7A. Adjacent rectangular units 412 are aligned along x direction and spaced apart by a gap $G_1$. Bottommost transition lines 402 in the rectangular units 412 have a same distance to the seal ring 442 in the section BC of the seal ring region 104. The length $L_1$ and the height $H_1$ are designed according to the property requirements of the transition region 420, such as the pattern density requirement. Each of the rectangular units 412 includes a plurality of transition lines 402. The transition lines 402 in each of the rectangular units 412 may be straight conductive lines that have various line width and disposed in various line pitches. In the present embodiments, the transition lines 402 in each of the rectangular units 412 include a same line width $w_1$ and a same line pitch $p_1$ (FIG. 7A). A pitch of the lines is defined as a dimension between adjacent lines (such as from an edge of one line to the same edge of the adjacent line).

FIG. 7B illustrates the transition region 420 including transition lines 402 disposed in rectangular units 412 in the section BC of the seal ring region 104, constructed in accordance with other embodiments. The transition region 420 in FIG. 7B is similar to the transition region 420 in FIG. 7A. The descriptions of the similar features are not repeated for simplicity. However, the transition region 420 in FIG. 7B further include metal bars added among the transition lines 402. For examples, the metal bars 406 are configured to connect adjacent transition lines 402. The metal bars 406 may be configured such that metal bars 406 in adjacent rows are digitalized or alternatively aligned. The added metal bars 406 can effectively tune the pattern density to improve pattern uniformity, thereby eliminating or reducing fabrication defects. For example, the fabrication method to form those conductive features may include plating. The uniform pattern density can effectively improve plating uniformity and reduce plating defect. The dimensions, such width and pitch, of the metal bars 406 in the transition region 420 provide more freedom to tune the pattern density and can be used to tune the pattern density in the transition region 420. For example, increasing the width and decreasing the pitch of the metal bars 406 can increase the pattern density.

Figure 7C:
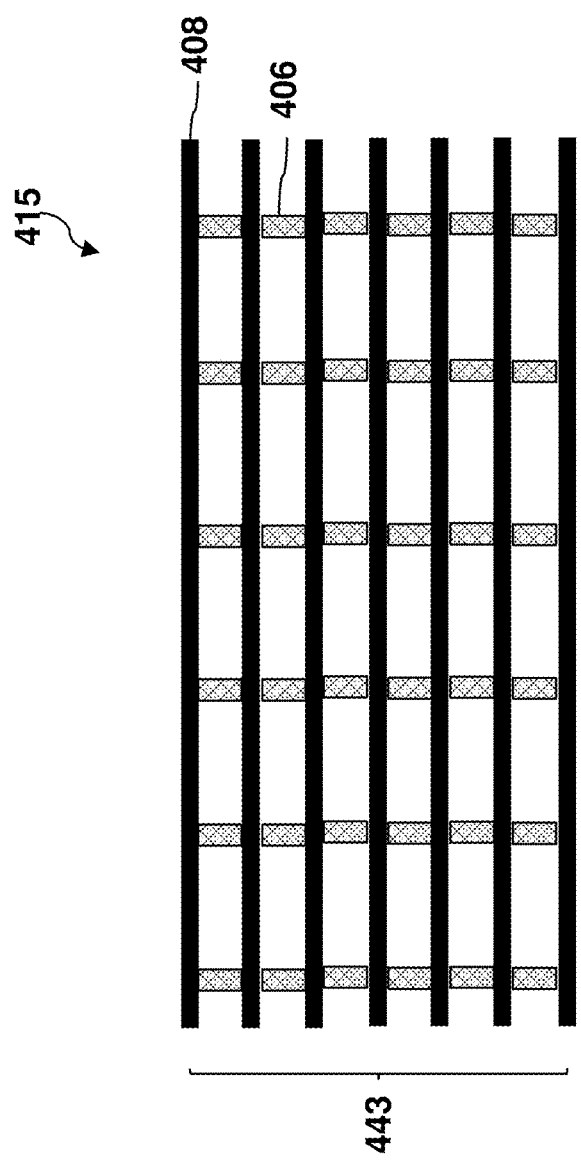
FIG. 7C is an enlarged top plan view of area 415 in FIG. 6, according to various aspects of the present disclosure.

FIG. 7C is an enlarged top plan view of area 415 in FIG. 6, according to various aspects of the present disclosure. Referring to FIG. 7C, the SRG region 443 (or 445 or 447 337) includes PERs 408 disposed in the rectangular area 415 in the section BC of the seal ring region 104. In the described embodiment, the PERs 408 are straight lines oriented along the x-direction. PERs 408 are different from seal rings (442, 444, 446 or 448) in term of width and pitch. For example, the PERs 408 includes a width less than the width of the seal rings. In another example, the PERs 408 includes a pitch less than the pitch of the seal rings. In some embodiments, the SRG region 443 further includes metal bars 406 added among the PERs 408. For examples, the metal bars 406 are configured to connect adjacent metal rings lines 408. The metal bars 406 may be configured such that metal bars 406 in adjacent rows are digitalized or alternatively aligned. Similarly, the metal bars 406 added in the SRG region 443 can effectively tune the pattern density to improve pattern uniformity, thereby eliminating or reducing fabrication defects. For example, the fabrication method to form those conductive features may include plating. The uniform pattern density can effectively improve plating uniformity and reduce plating defect. The dimensions, such width and pitch, of the metal bars 406 in the SRG region 443 provide more freedom to tune the pattern density and can be used to tune the pattern density of the SRG regions 443. For example, increasing the width and decreasing the pitch of the metal bars 406 can increase the pattern density. The SRG region 443 is described for illustration. the implementation of the metal bars 406 are also applicable to the SRG regions 445 and 447. For example, the metal bars 406 may be added to the SRG regions 445 and 447 as well with similar or alternatively different configuration to provide more freedom to tune the pattern density.

Figure 8:
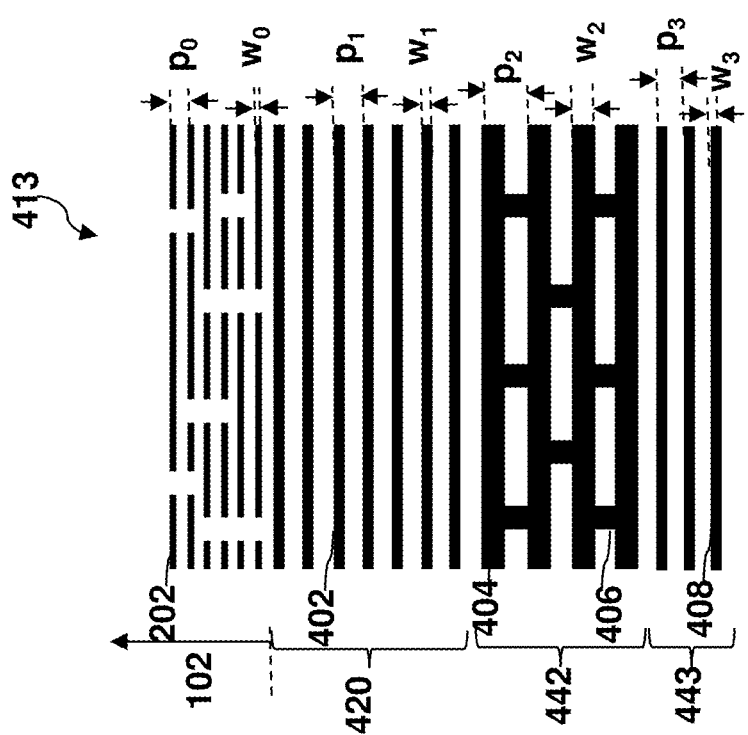
FIGS. 8 and 15 are enlarged top plan views of area 413 in FIGS. 6 and 14, respectively, according to various aspects of the present disclosure.

FIG. 8 is an enlarged top plan view of area 413 shown in FIG. 6. The transition lines 402 are lengthwise parallel to the conductive lines 202 in the circuit region 102 and lengthwise parallel to the conductive rings 404 and PERs 408 in the section BC of the seal ring region 104. The conductive lines 202 in the circuit region 102, the transition lines 402 in the transition region 420, the conductive rings 404 in the sealing region 440, and the PERs 408 in the SRG region 443 have line width $w_0$, $w_1$, $w_2$, and $w_3$, respectively. Similarly, the conductive lines 202 in the circuit region 102, the transition lines 402 in the transition region 420, the conductive rings 404 in the sealing region 440 and the PERs 408 in the SRG region 443 have line pitches $p_0$, $p_1$, $p_2$, and $p_3$, respectively. In the present embodiments, the line width $w_1$ is greater than the line width $w_0$ and less than the line width $w_2$. Similarly, the line pitch $p_1$ is greater than the line pitch $p_0$ and less than the line pitch $p_2$. In addition, the transition region 420 has a pattern density $d_1$ that is greater than a pattern density do of the circuit region 102 and less than a pattern density $d_2$ in the sealing region 440. The transition lines 402 are the same as the PERs 408 except each of the PERs 408 forms a closed loop around the circuit region 102, while the transition lines 402 are straight lines. The transition lines 402 in the transition region 420 are such configured (in line widths, line pitches, and pattern densities, etc.) to alleviate the issues in subsequent processes caused by the differences between the circuit region and the sealing region. The transition region 420 provides buffer between the circuit region 102 and the sealing region 440 to avoid issues that may happen otherwise, such as over etching of the components in the sealing region due to the greater line widths and line pitches, and/or the dishing issue due to the differences in the pattern density.

Figure 9:
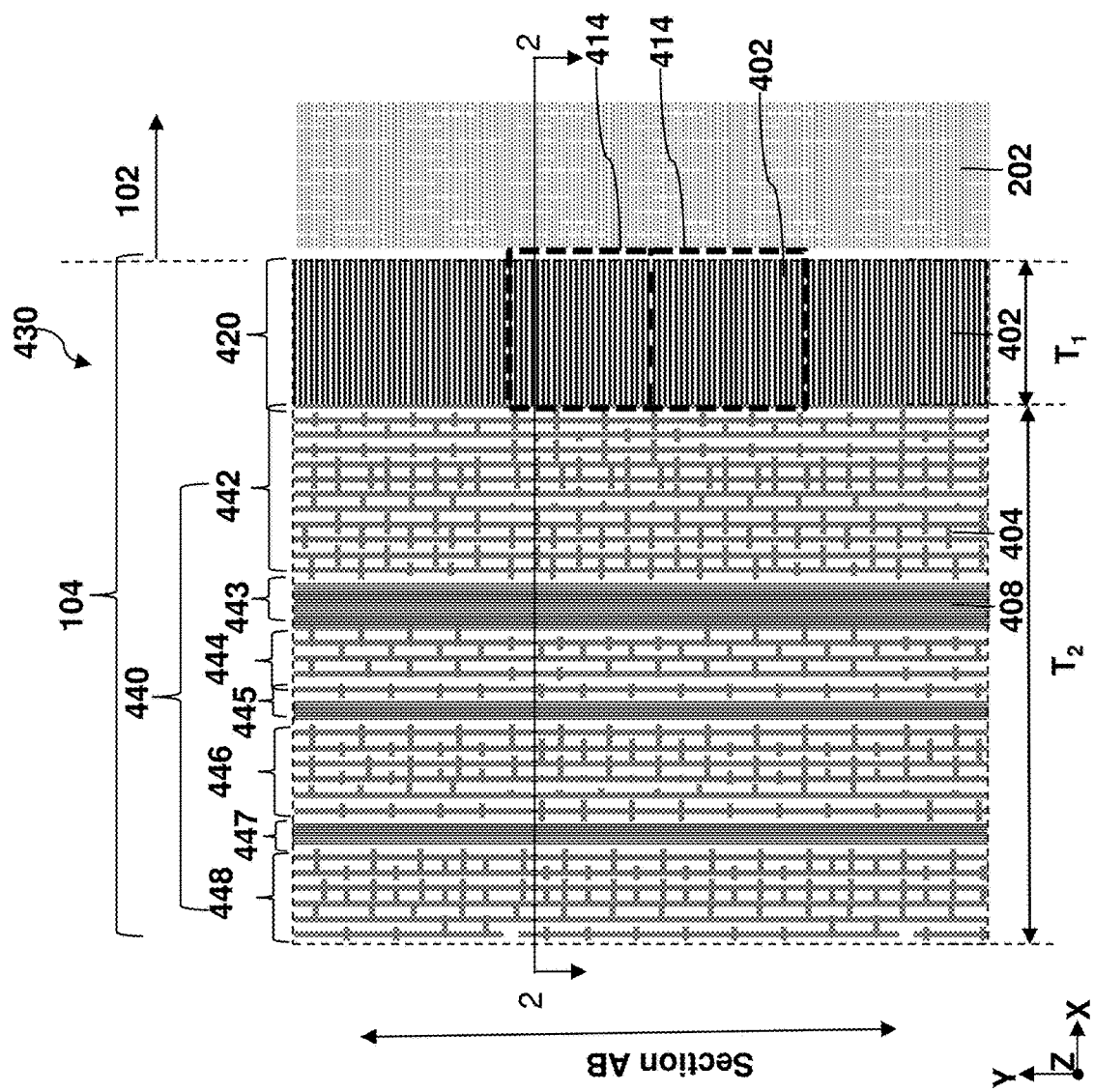
FIG. 9 is an enlarged top plan view of area 430 in FIG. 5, according to various aspects of the present disclosure.

FIG. 9 is an enlarged top plan view of the area 430 shown in FIG. 5. The area 430 is selected from the section AB of the seal ring region 104 for illustration purposes. The same principles apply to the section CD equally except that the section CD is a mirrored image of the section AB along a center line of the semiconductor structure 100 along y direction. The configurations of circuit region 102, the sealing region 440, and the transition region 420 are the same as discussed in accordance with FIGS. 6-8 except what are explicitly discussed below. In the depicted embodiments, the transition region 420 in the section AB of the seal ring region 104 includes rectangular units 414 aligned along y direction. Each of the rectangular units 414 includes transition lines 402 substantially parallel to the conductive lines 202 in the circuit region 102. The transition lines 402 are aligned along y direction in section AB of the seal ring region 104. In other words, ends of the transition lines 402 proximal the seal ring 442 have a same distance from the seal ring 442. Different from the section BC of the sealing region 440, the transition lines 402 in the section AB of the seal ring region 104 are disposed perpendicular to the conductive rings 404 and 408. Particularly, conductive lines 202 and transition lines 402 are oriented in the same direction while metal rings 404 and PERs 408 change the orientations so to be in parallel with the corresponding edge of the chip.

Figure 10:
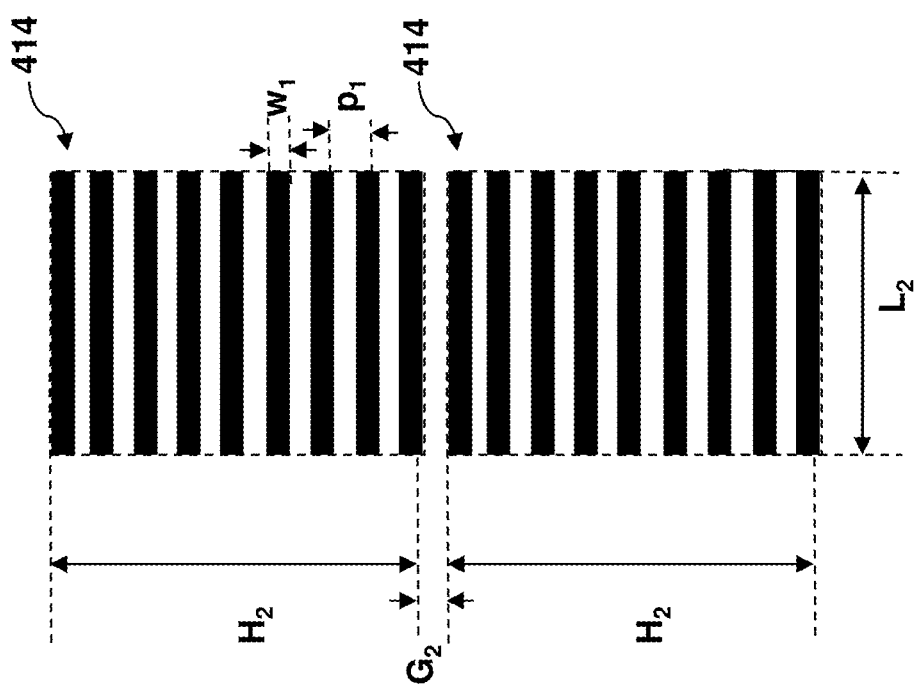
FIG. 10 is an enlarged top plan view of area 414 in FIG. 9, according to various aspects of the present disclosure.

Referring to FIG. 10, the rectangular units 414 may be of various sizes and of various length to width ratios. In the present embodiments, the rectangular units 414 have uniform sizes and uniform length to width rations defined by a length L2 and a height H2, where the length L2 equals to the height H1 and the height H2 equals to the lengths L1. The gap between the rectangular units 414 may be the same with or vary from each other. In the present embodiments, the rectangular units 414 have uniform gaps G2 therebetween, wherein the gaps G2 equals to the pitch p1. The line widths and the line pitches in each of the rectangular units 414 may vary and may be the same as or different from the line width w1 and the line pitch p1. In the present embodiments, the transition lines 402 in the rectangular units 414 have the line width w1 and the line pitch p1 same as the transition lines 402 in the section BC. As such, the thickness T1 of the transition region 420 in the section AB is the same as in the section BC (L2 equals H1), and therefore providing smooth transition from the circuit region 102 to the seal ring region 104 around the entire periphery of the circuit region 102.

Figure 11A:
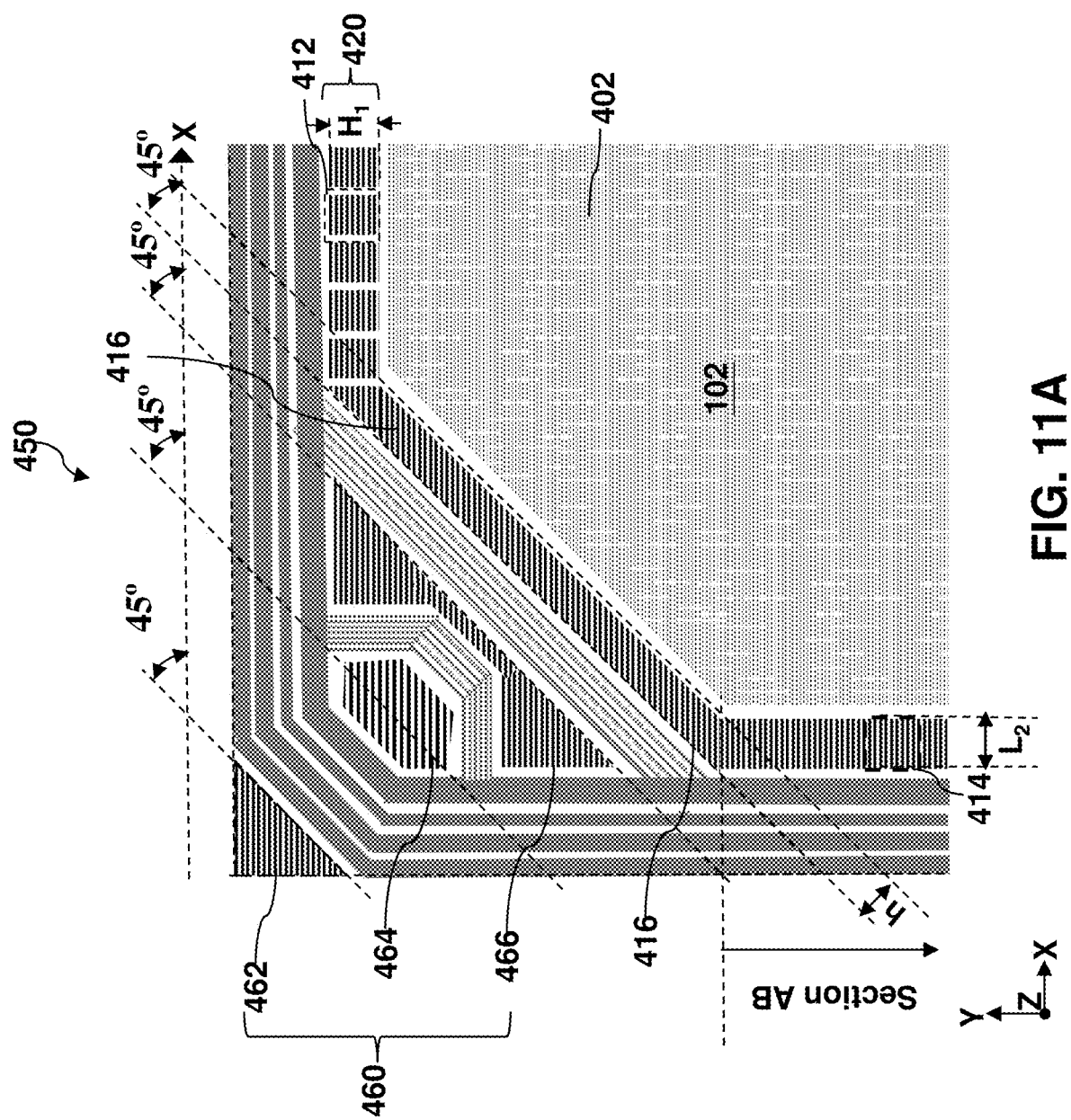
FIGS. 11A, 16, and 17 are enlarged top plan views of area 450 in FIG. 5, according to various aspects of the present disclosure.

FIG. 11A is an enlarged top plan view of the area 450 in FIG. 5. The area 450 is selected from the corner A of the seal ring region 104 for illustration purposes. The same principles apply to the corners B, C and D equally, except that the corners B, C and D are mirrored images of the corner A along a center line along x direction, a diagonal line along BD direction, and a center line along y direction, respectively.

The transition region 420 in the area 450 includes a corner unit 416. The corner unit 416 may be in various suitable shapes. In the present embodiments, the corner unit 416 is a right trapezoid shape. The two parallel edges of the right trapezoid each forms a 45° angle with x direction. One of the non-parallel edge proximal the section AB is substantially parallel to the transition lines. The other non-parallel edge proximal the section AD is substantially perpendicular to the transition lines. A length of each non-parallel edge equals to the height $H_1$ and the width $L_2$. A height h of the right trapezoid shape, which is also the thickness T of the corner unit 416, is less than the height $H_1$ and the width $L_2$. The corner unit 416 may include transition lines 402 oriented lengthwise along x direction (parallel to other transition lines 402 in the transition region) of various width, length, and line pitches. In the present embodiments, the transition lines 402 have a uniform width $w_1$ and the uniform line pitch $p_1$. As such, the transition region 420 have the uniform properties, such as line length, line width, thickness, and pattern density at the corner A. The uniform properties of the transition region 420 improve the issues of over etching or dishing in subsequent processes.

Still referring to FIG. 11A, the seal ring region 104 incudes four corner regions 460 at the corner A, B, C, and D of the chip. Each of the corner region 460 includes an outer corner region 462, an inner corner region 464, and an inner corner region 466. The outer corner region 462 is a right triangle shape with two of the right-angle edges along the edges of the seal ring region 104. The inner corner region 464 is a hexagon shape, the longest diagonal line of which forms a 45° angle with the x direction. The inner corner region 466 is an irregular shape formed by connecting two right triangle shapes with a rectangular shape. The hypotenuses of the two right triangles and a long edge of the rectangle are disposed along a straight line having a 45° angle with the x direction. The two right triangles and the rectangle are disposed on the same side of the 45° straight line. The outer corner region 462, the inner corner region 464, and the inner corner region 466 may include conductive lines of various line widths and line pitches. The conductive lines may be disposed in various proper directions. In the present embodiments, the outer corner region 462, the inner corner region 464, and the inner corner region 466 each includes metal lines parallel to the transition lines 402. The metal lines in the corner regions 460 have uniform line width $w_1$ and uniform line pitch $p_1$. The corner regions 460 are such configured to enhance the processability and the strength of the seal ring region 104.

Figure 11B:
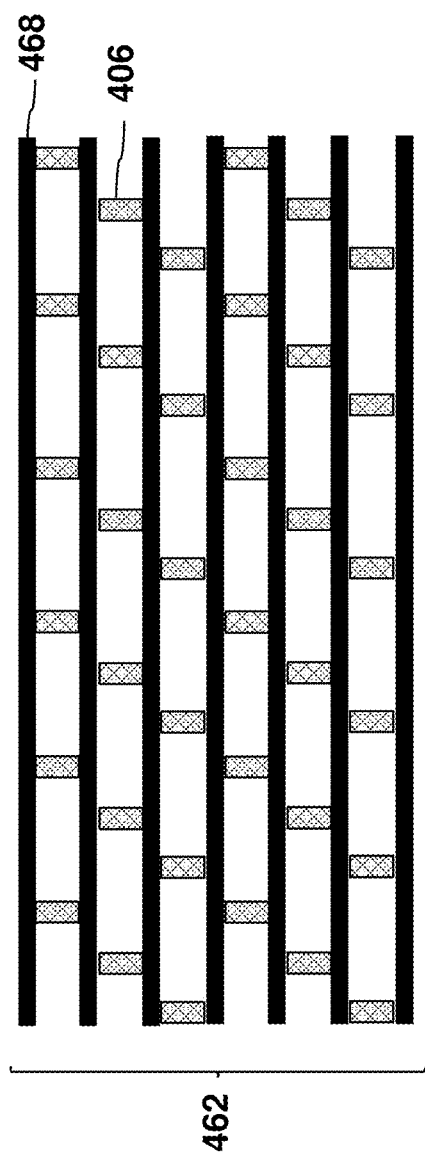
FIG. 11B is an enlarged top plan view of a portion of the semiconductor structure in FIG. 11A, according to various aspects of the present disclosure.

FIG. 11B is an enlarged top plan view of a corner region (462, 464 or 466) of the semiconductor structure shown in FIG. 11A, constructed according to some embodiments. As illustrated in FIG. 11B, the corner region 462 includes conductive lines (metal lines) 468 and further includes metal bars 406 added among the metal lines 468. For examples, the metal bars 406 are configured to connect adjacent metal lines 468. The metal bars 406 may be configured such that metal bars 406 in adjacent rows are digitalized or alternatively aligned. Similarly, the metal bars 406 added in the corner region 462 can effectively tune the pattern density to improve pattern uniformity, thereby eliminating or reducing fabrication defects. The dimensions, such width and pitch, of the metal bars 406 in the corner region 462 provide more freedom to tune the pattern density and can be used to tune the pattern density of the corner regions. For example, increasing the width and decreasing the pitch of the metal bars 406 can increase the pattern density. The corner region 462 is described for illustration. the implementation of the metal bars 406 are also applicable to the corner regions 464 and 466. For example, the metal bars 406 may be added to the corner regions 464 and 466 as well with similar or alternatively different configuration.

Figure 12:
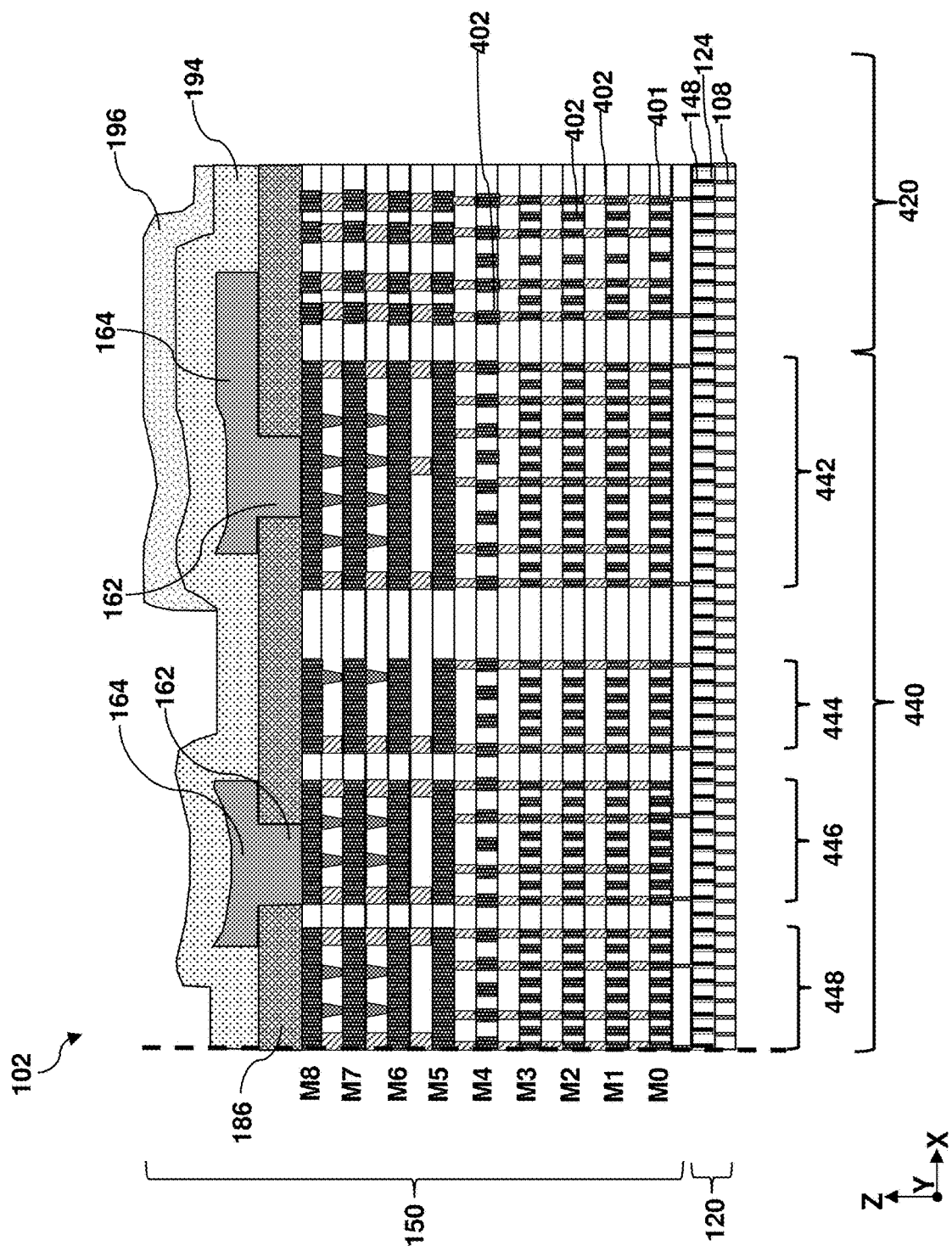
FIG. 12 is a cross-sectional view of the semiconductor structure in FIG. 5 along the line "1-1", according to various aspects of the present disclosure.

FIG. 12 is a cross-sectional view of the seal ring region 104 along the line "1-1" in the rectangle 410 of FIG. 5. The seal ring region 104 includes a substrate 120 and a seal ring structure 150 disposed over the substrate 120. The seal ring structure 150 vertically extends from the substrate, through the interconnect structure, and up to the passivation layer to provide proper protection to the circuit in the circuit region 102. However, the seal ring structure 150 in each region is configured differently as described below. The substrate 120 includes active regions 108, gate stacks 124 and source/drain contacts 148. Each of the gate stacks 124 is disposed over a channel region of an active region 108. Each of the source/drain contacts 148 is disposed over a source/drain feature that is disposed over a source/drain region of an active region. The seal ring region 104 may include multiple metal layers, such as 9 to 14 metal layers, embedded in intermetal dielectric (IMD) layers. In the depicted embodiments, the seal ring region 104 includes nine metal layers—a first metal layer M0, a second metal layer M1, a third metal layer M2, a fourth metal layer M3, a fifth metal layer M4, a sixth metal layer M5, a seventh metal layer M6, an eighth metal layer M7, and a ninth metal layer M8. In the sealing region 440, each of the metal layers include one or more metal rings 143 and one or more via rings 144. A via ring is disposed vertically between two metal rings in two adjacent metal layers and connects the two adjacent metal layers. The metal rings and the via rings extends lengthwise completely around a closed loop that surrounds the circuit region 102 (FIG. 5). The seal ring structure 150 in the seal ring region 104 protects the circuit region 102 from damages such as dusts, moisture, and/or mechanical stress. Although not depicted in FIG. 12, PERs may be inserted in SRG regions between the seal rings 442, 444, 446, and 448 in some embodiments such as the ones depicted in FIGS. 6, 7A and 9.

Same as the sealing region 440, the transition line 402 in the transition region 420 are also disposed in all the metal layers from M0 to M8, each of which includes transition lines 402 and one or more vias 401. Although the cross-sectional view of the transition region 420 is very similar to that of the sealing region 440, they are different in many ways. For example, the seal rings 442, 444, 446, and 448 in the sealing region 440 continuously extend around the circuit region 102 and particularly oriented lengthwise along y direction in the section AB of the seal ring region 104, while none of the transition lines 402 and the vias 401 in the transition region 420 form ring shape. A conductive structure in a ring shape means that the conductive feature continuously extends around the circuit region. Instead, the transition lines 402 are straight conductive lines parallel to each other and disposed evenly in the transition region 420. The transition region 420 extends around the entire circuit region 102 and form a loop from a top view (FIG. 5).

In some embodiments, the substrate 120 may be a bulk silicon (Si) substrate. Alternatively, substrate 120 may include elementary semiconductor, such as germanium (Ge); a compound semiconductor, such as silicon carbide (SiC), gallium arsenide (GaAs), gallium phosphide (GaP), indium phosphide (InP), indium arsenide (InAs), and/or indium antimonide (InSb); an alloy semiconductor, such as silicon germanium (SiGe), gallium arsenic phosphide (GaAsP), aluminum indium arsenide (AlInAs), aluminum gallium arsenide (AlGaAs), gallium indium arsenide (GaInAs), gallium indium phosphide (GaInP), and/or gallium indium arsenic phosphide (GaInAsP); or combinations thereof. In some implementations, the substrate 120 includes one or more group III-V materials, one or more group II-VI materials, or combinations thereof. In still some instances, the substrate 120 is a semiconductor-on-insulator substrate, such as a silicon-on-insulator (SOI) substrate, a silicon germanium-on-insulator (SGOI) substrate, or a germanium-on-insulator (GeOI) substrate. In still some embodiments, the substrate 120 may be diamond substrate or a sapphire substrate.

The substrate 120 includes various semiconductor structures, such as active regions, gate structures disposed over channel regions of the active regions, source/drain features disposed over source/drain regions of the active regions, source/drain contacts disposed over source/drain features, and gate contact vias disposed over the gate structures, and the interconnect structure disposed thereover to couple various components into an integrated circuit. The active regions may include silicon (Si) or other suitable semiconductor material, such as germanium (Ge) or silicon germanium (SiGe). Each of the segmented gate structures includes a gate dielectric layer and a gate electrode layer over the gate dielectric layer. In some embodiments, the gate dielectric layer includes an interfacial layer and a high-K gate dielectric layer. High-K dielectric materials, as used and described herein, include dielectric materials having a high dielectric constant, for example, greater than that of thermal silicon oxide (~3.9). The interfacial layer may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The high-K gate dielectric layer may include hafnium oxide. Alternatively, the high-K gate dielectric layer may include other high-K dielectric materials, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material. The high-K gate dielectric layer may be formed by ALD, physical vapor deposition (PVD), CVD, oxidation, and/or other suitable methods.

The IMD layer may include materials such as tetraethylorthosilicate (TEOS) oxide, un-doped silicate glass, doped silicon oxide, borophosphosilicate glass (BPSG), fused silica glass (FSG), phosphosilicate glass (PSG), boron doped silicon glass (BSG), silicon oxycarbide, and/or other suitable dielectric materials, deposited by CVD, flowable CVD (FCVD), other suitable method or a combination thereof.

The gate electrode layer may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. In various embodiments, the gate electrode layer may be formed using ALD, PVD, CVD, e-beam evaporation, or other suitable process.

Source/drain features may include silicon (Si) doped with an n-type dopant, such as phosphorus (P) or arsenic (As) or silicon germanium (SiGe) doped with a p-type dopant, such as boron (B) or boron difluoride ($BF_2$). The source/drain contacts may include a silicide layer, a metal fill layer disposed over the silicide layer, and a barrier layer to separate the metal fill layer from the IMD layer. The barrier layer may include titanium nitride or tantalum nitride and functions to prevent electro-migration in the metal fill layer. The silicide layer may include titanium silicide, tantalum silicide, cobalt silicide, nickel silicide, or tungsten silicide. The silicide layer is disposed at the interface between the metal fill layer and the source/drain features to reduce contact resistance. The metal fill layer may include ruthenium (Ru), copper (Cu), nickel (Ni), cobalt (Co), tungsten (W), or other suitable metal material.

The seal ring structure 150 further includes a first passivation layer 186 disposed over the topmost metal layer (e.g., M8), via rings 162 embedded in the first passivation layer 186, contact pad ring 164 disposed over the first passivation layer 186 and the contact via rings 162, a second passivation layer 194 disposed over the contact pad rings 164 and the first passivation layer 186, and a polymer layer 196 over the second passivation layer 194. The contact via ring 162 vertically extends through the first passivation layer 186 to couple to one of the topmost metal lines in the topmost metal layer. The contact pad rings 164 and the contact via rings 162 may be formed together by a dual damascene process that further includes forming dual damascene openings; depositing the metal fill layer in the dual damascene openings and performing a chemical mechanical polishing (CMP) process. In these embodiments, the contact pad ring 164 and the underlying contact via ring 162 are continuous without an observable interface. The first passivation layer 186, the via rings 162, the contact pad ring 164, the second passivation layer 194, and the polymer layer 196 each extends around the circuit region 102 to form a closed loop.

Figure 13:
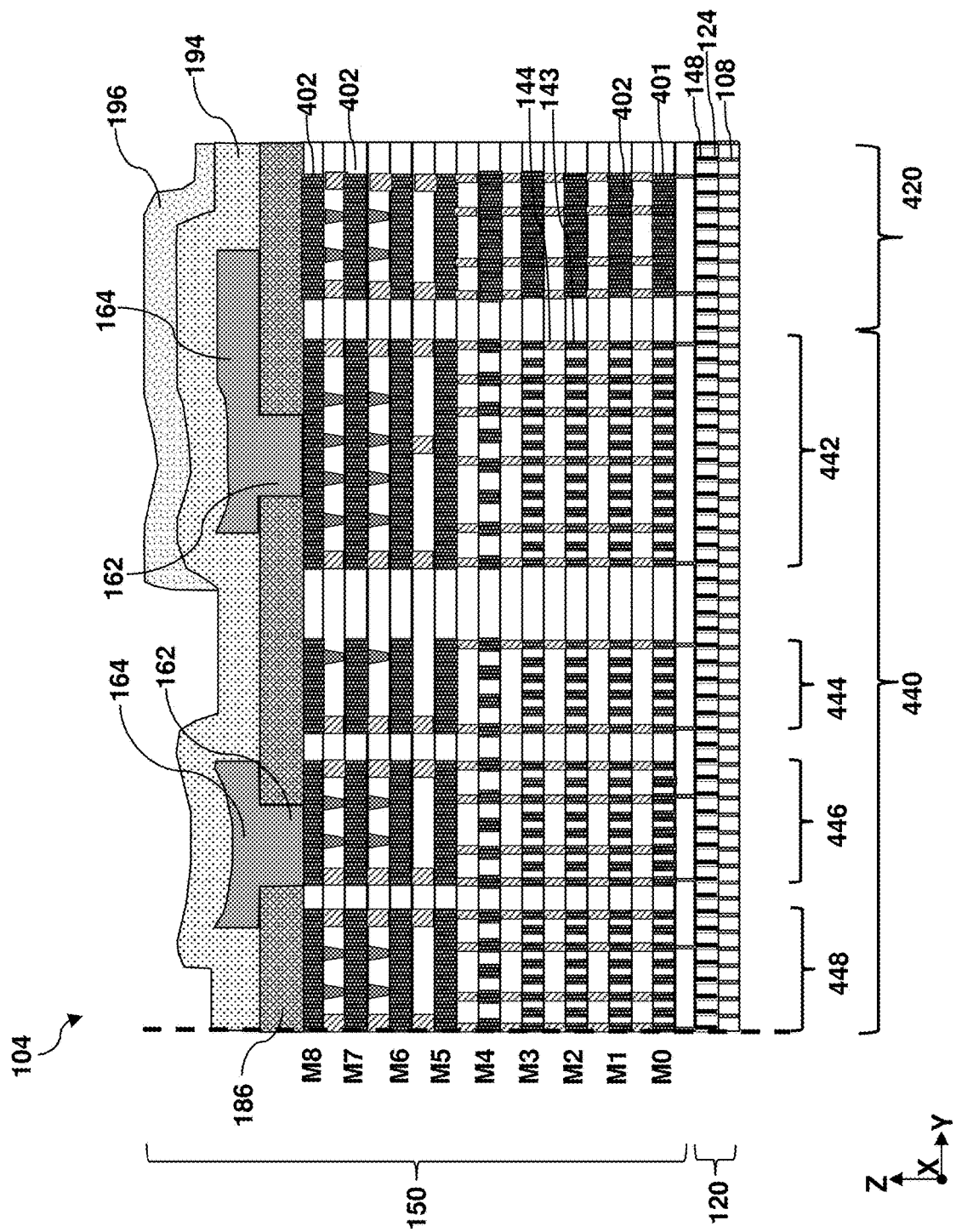
FIG. 13 is a cross-sectional view of the semiconductor structure in FIG. 5 along the line "2-2", according to various aspects of the present disclosure.

FIG. 13 is a cross-sectional view of the seal ring region 104 along the line "2-2" in FIG. 5. The line "2-2" cuts the transition lines 402 along a perpendicular line of the transition lines 402 in a rectangular unit 430. In the depicted embodiment, the numbers of the transition lines 402 included in the rectangular unit 430 gradually decrease from the bottommost metal layer to the topmost metal layer. For example, the rectangular unit 430 includes seven metal lines 402 in each of the metal layers M0, M1, M2, and M3, five metal lines 402 in the metal layer M4, and four metal lines 402 in the metal layer M5, M6, M7, and M8. Furthermore, the dimensions, such as width and pitches of the transition lines 402 increase from the bottommost metal layer to the topmost metal layer, according to some embodiments. Similarly, the circuit region 102 includes bonding pads and redistribution layer (RDL) formed in the passivation layers. In some embodiments, the contact pad rings 164 and the contact vias ring 162 in the seal ring region 104 may be simultaneously formed with bonding pads and redistribution layer (RDL) in the circuit region 102 by depositing a metal fill layer in a dual damascene process.

In some embodiments, the first passivation layer 186 and the second passivation layer 194 may include undoped silicate glass (USG), silicon nitride, silicon oxide, or silicon oxynitride. The contact via rings 162 and the contact pad ring 164 may include aluminum (Al), copper (Cu), aluminum-copper (Al—Cu), a suitable metal, or a suitable metal alloy. The polymer layer 196 may include epoxy, polyimide (PI), benzocyclobutene (BCB), or polybenzoxazole (PBO). In one embodiment, the polymer layer 196 includes polyimide (PI).

Figure 14:
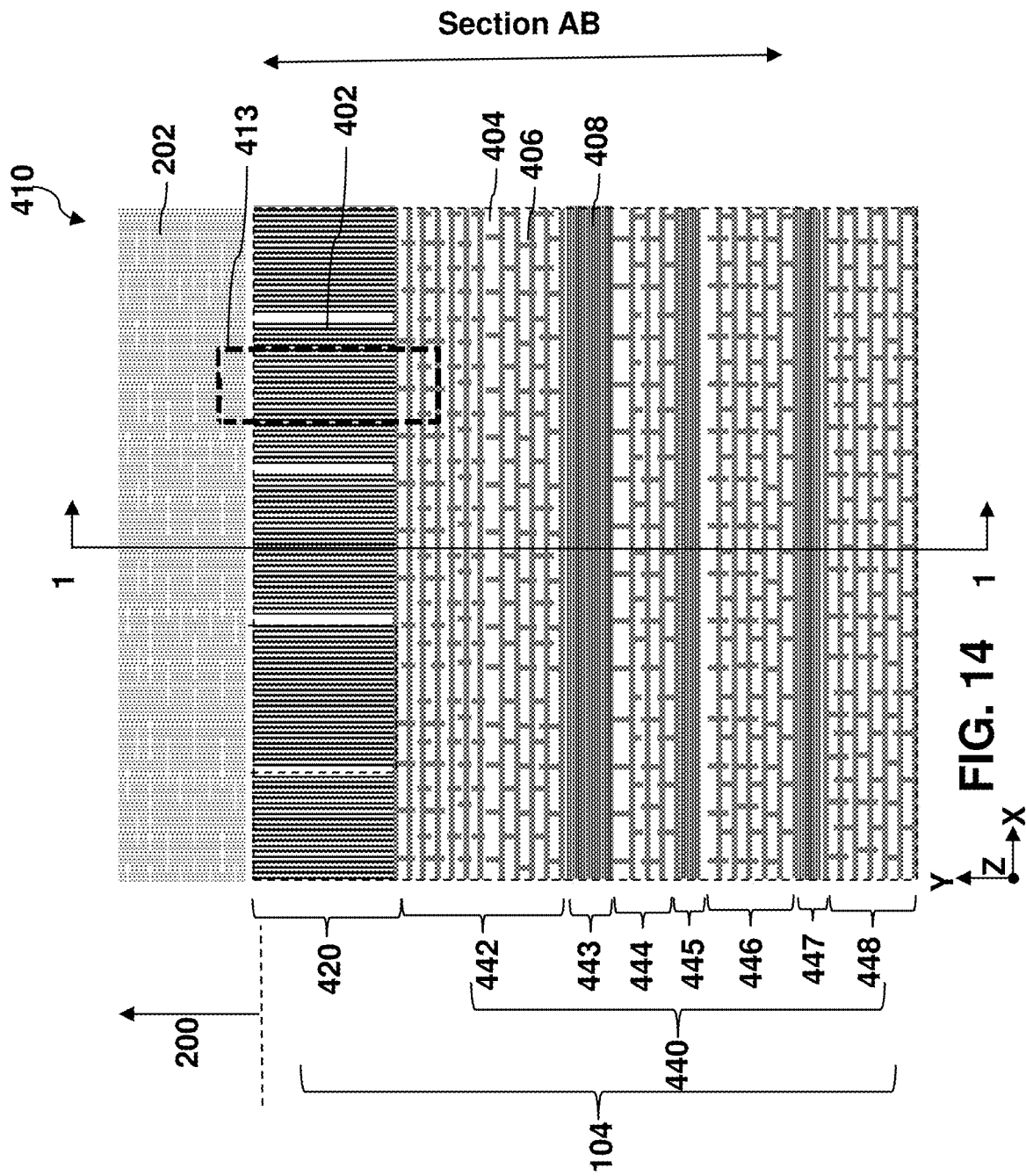
Figure 15:
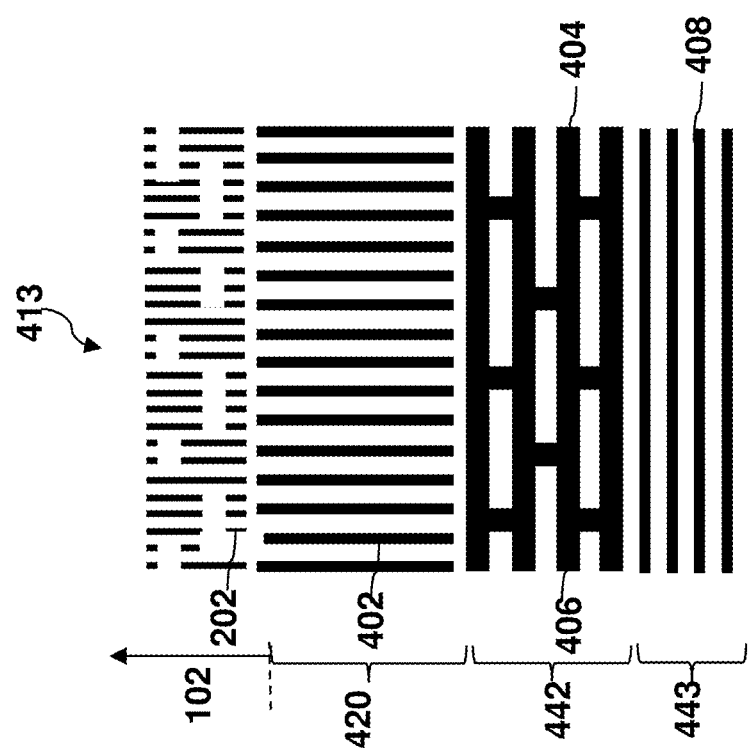

FIG. 14 is an enlarged top plan view of the area 410 in FIG. 5. FIG. 15 is an enlarged top plan views of the area 413 in FIG. 14 (or FIG. 6). FIGS. 14 and 15 illustrate alternative embodiments of the ones depicted in FIGS. 6 and 7. For example, FIGS. 6 and 7 depict the area 410 in the metal layer M8, M6, M4, M2, or M0, while the FIGS. 10 and 11 depict the area 410 in the metal layer M7, M5, M3, or M1. The metal layer M8 and M7 are used for illustration purposes hereafter. The configurations of the seal ring region 104 in metal layer M7 are substantially the same as the configurations in the metal layer M8, except the aspects explicitly discussed below. The conductive lines 202 in the metal layer M7 and the conductive lines 202 in the metal layer M8 are substantially perpendicular. The transition lines 402 in the metal layer M7 are oriented in parallel with the conductive lines 202 in the metal layer M7; and the transition lines 402 in the metal layer M8 are oriented in parallel with the conductive lines 202 in the metal layer M8 to provide proper transition from the circuit region 102 to the seal ring region 104. In contrast, the seal rings, such as 442, 444, 446 and 448, keep their orientations through various metal layers, being always in parallel with the adjacent edge of the chip. For example, segments of the seal rings associated with the chip edge AB are in parallel with the chip edge AB, segments of the sealing rings associated with the chip edge BC are in parallel with the chip edge BC, and so on.

Particularly, the transition lines 402 as well as the conductive lines 202 in the metal layer M7 are disposed lengthwise along y direction. The transition lines 402 and the conductive lines 202 in the metal layer M7 are substantially perpendicular with the transition lines 402 and the conductive lines 202 in the metal layer M8. The conductive rings 404 in the metal layer M7 are parallel to the conductive rings 404 in the metal layer M8. In addition, the transition lines 402 and the conductive lines 202 are parallel to the metal rings 404 and 408 in the section BC of the metal layer M8 (FIG. 6), while the transition lines 402 and the conductive lines 202 are perpendicular to the metal rings 404 and 408 in the section BC of the metal layer M7 (FIG. 14). In some embodiments, a line width of the transition lines 402 in metal layer M7 is less than the line width $w_1$ of the transition lines 402 in metal layer M8. Similarly, a line pitch of the transition lines 402 is less than the line pitch $p_1$.

Figure 16:
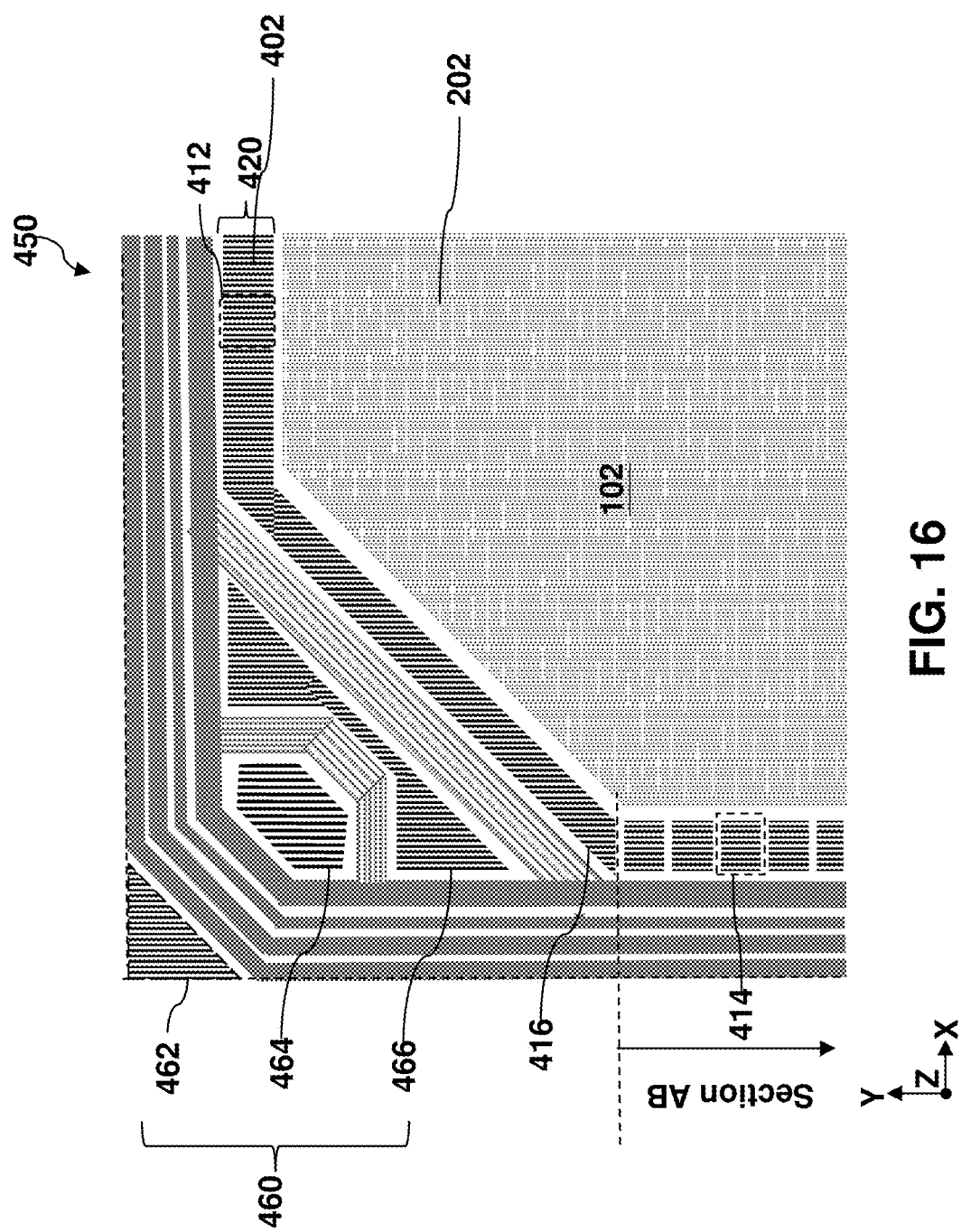

FIG. 16 is an enlarged top plan view of the area 450 in FIG. 5, illustrating an alternative embodiment to that depicted in FIG. 1A. For example, FIG. 1A depicts the area 450 in the metal layer M8, M6, M4, M2, or M0, while the FIG. 16 depicts the area 450 in the metal layer M7, M5, M3, or M1. The metal layer M8 and M7 are used for illustration purposes hereafter. For example, FIG. 11A depicts the area 450 in the metal layer M8 while the FIG. 16 depicts the area 450 in the metal layer M7 adjacent to the metal layer M8. The configurations of the seal ring region 104 in metal layer M7 are the same as the configurations in the metal layer M8, except the aspects explicitly discussed below. The transition lines 402 as well as the conductive lines 202 in the metal layer M7 are disposed lengthwise along y direction, which is substantially perpendicular to the transition lines 402 and the conductive lines 202 in the metal layer M8. The conductive lines in the corner region 462, 464, and 466 in the metal layer M7 are disposed lengthwise along y direction, which is parallel to the transition lines 402 in metal layer M7 and perpendicular to the conductive lines in the corner regions of the metal layer M8.

Figure 17:
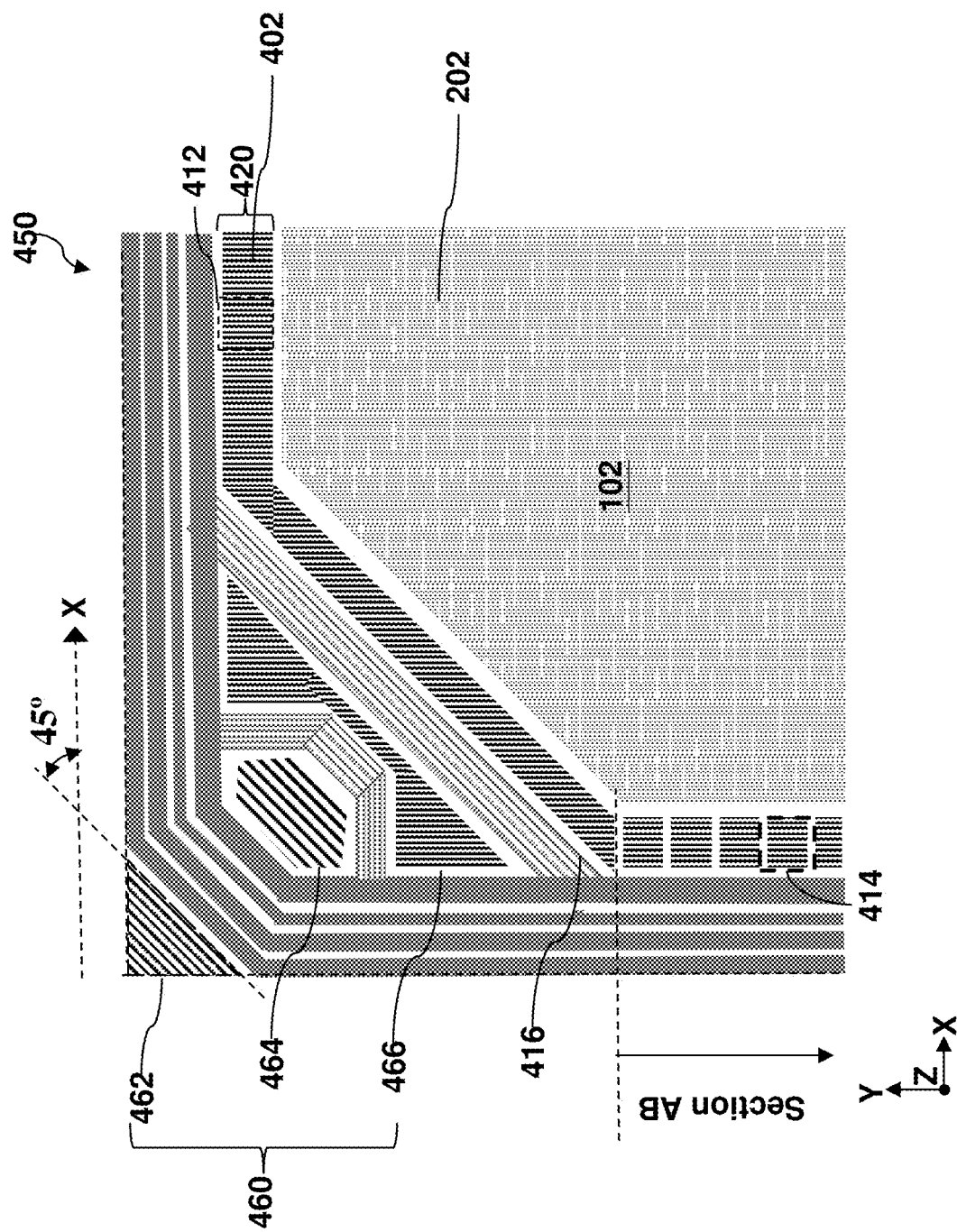

FIG. 17 is an enlarged top plan view of the area 450 in FIG. 5, illustrating an alternative embodiment of that depicted in FIG. 16. For example, FIG. 17 depicts the area 450 in a metal layer different from the metal layer depicted in FIG. 16. The configurations of the area 450 in FIG. 17 are substantially the same as the configurations depicted in FIG. 16, except the aspects explicitly discussed below. As depicted in FIG. 17, the metal lines in the corner regions 462 and 464, and 466 may be disposed along different directions. For example, the metal lines in the corner regions 462 and 464 are disposed along a direction that forms a 45° angle with x direction, while the conductive lines in the corner region 466 are disposed parallel to the transition lines 402. Such configurations provide process flexibility.

Figure 18:
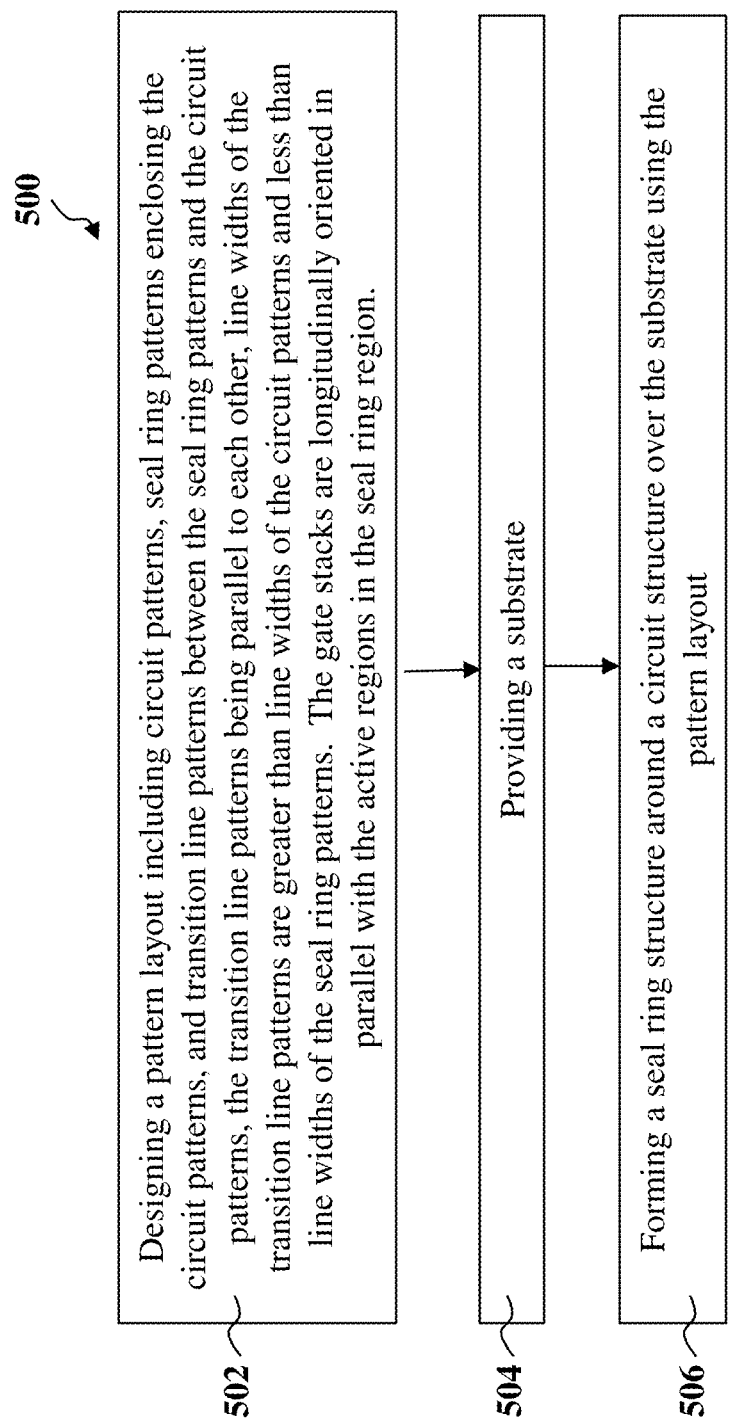
FIG. 18 is a flowchart of a method making the semiconductor structure in FIG. 1, according to various aspects of the present disclosure.

FIG. 18 is a method 500 of fabricating the semiconductor structure 100 in FIG. 5. The method 500 includes a block 502 to design a pattern layout, a block 504 to provide a semiconductor substrate, and a block 506 by forming a seal ring structure and a circuit structure on the substrate using the pattern layout. The method 500 designs a pattern layout including conductive features (simply circuit patterns) in the circuit region, seal rings (simply seal ring patterns) in the sealing region enclosing the circuit patterns, and transition lines (simply transition line patterns) in the transition region between the seal ring patterns and the circuit patterns. Particularly, in the seal ring region, the gate stacks and active regions are longitudinally oriented in parallel, and the gate stacks are completely landing on the active regions. The layout patterns reflect the configurations discussed above in accordance with FIGS. 5-17. For example, the transition line patterns are parallel to each other. In another example, line widths of the transition line patterns are greater than line widths of the circuit patterns and less than line widths of the seal ring pattern. The method 500 subsequently provides (or being provided with) a substrate 120. Thereafter, the method 500 forms the semiconductor structure 100 discussed above in accordance with FIGS. 1-17 using the pattern layout.

Figure 19:
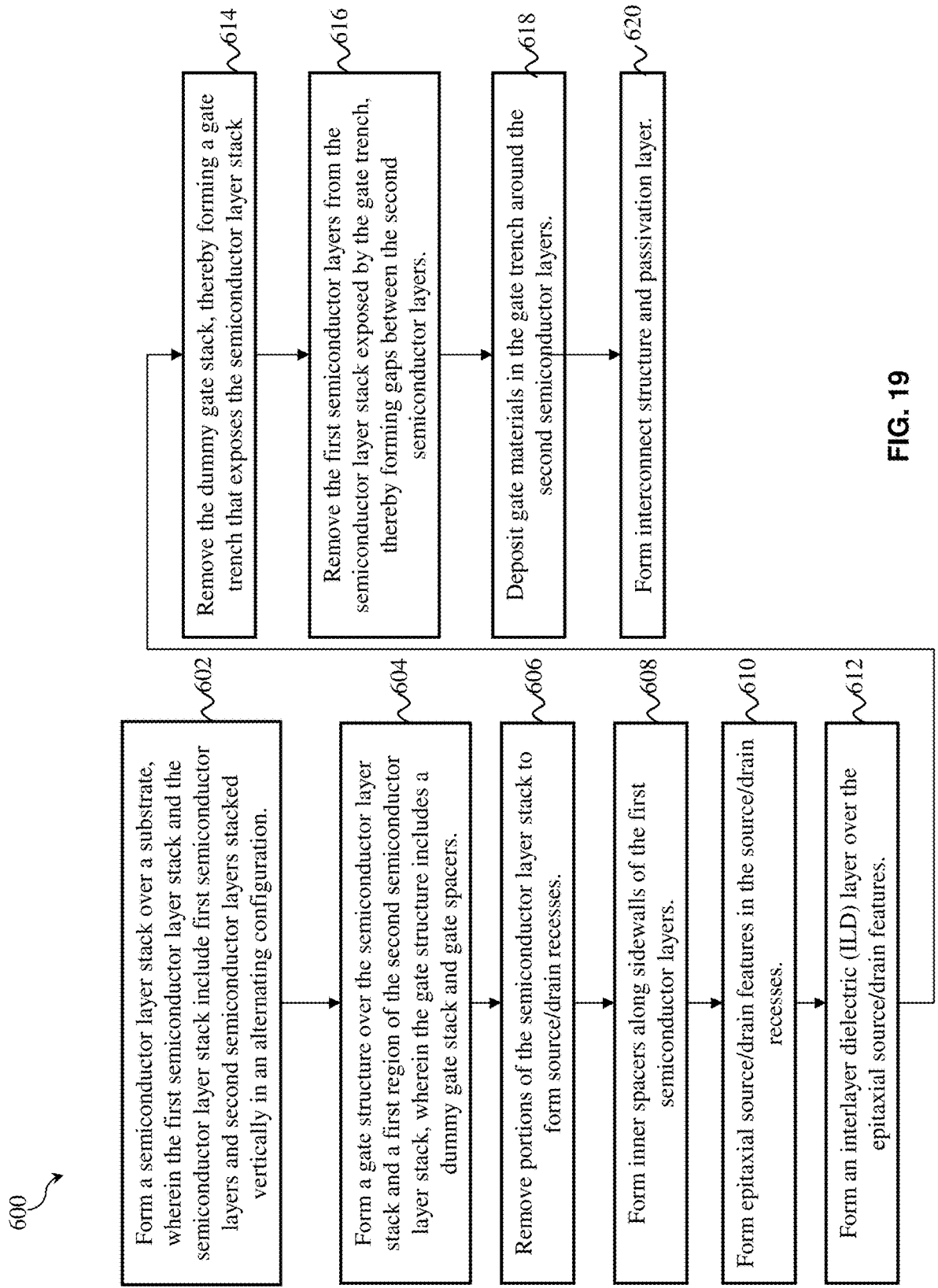
FIG. 19 is a flowchart of a method making the semiconductor structure in FIG. 1, according to various aspects of the present disclosure.

The method 600 to form the semiconductor structure 100 is further described with reference to FIG. 19 as a flowchart, constructed in accordance with some embodiments. In some embodiments, method 600 fabricates a semiconductor structure with multi-channel devices that includes p-type GAA transistors and n-type GAA transistors. At block 602, a first semiconductor layer stack and a second semiconductor layer stack are formed over a substrate. The first semiconductor layer stack and the second semiconductor layer stack include first semiconductor layers and second semiconductor layers stacked vertically in an alternating configuration. At block 604, a gate structure is formed over a first region of the first semiconductor layer stack and a first region of the second semiconductor layer stack. The gate structure includes a dummy gate stack and gate spacers. At block 606, portions of the first semiconductor layer stack in second regions and portions of the second semiconductor layer stack in second regions are removed to form source/drain recesses. At block 608, inner spacers are formed along sidewalls of the first semiconductor layers in the first semiconductor layer stack and the second semiconductor layer stack. At block 610, epitaxial source/drain features are formed in the source/drain recesses. At block 612, an interlayer dielectric (ILD) layer is formed over the epitaxial source/drain features. At block 614, the dummy gate stack is removed, thereby forming a gate trench that exposes the first semiconductor layer stack in a p-type gate region and the second semiconductor layer stack in n-type gate region. At block 616, the first semiconductor layers are removed from the first semiconductor layer stack and the second semiconductor layer stack exposed by the gate trench, thereby forming gaps between the second semiconductor layers. At block 618, various gate materials are deposited into the gate trench to form gate stack. At block 620, an interconnect structure and a passivation layer are formed. Additional processing is contemplated by the present disclosure. Additional steps can be provided before, during, and after method 600, and some of the steps described can be moved, replaced, or eliminated for additional embodiments of method 600. The discussion that follows illustrates various embodiments of nanowire-based integrated circuit devices that can be fabricated according to method 600.

The present disclosure provides the seal ring structure with active regions and gate stacks configured with effect protection to the devices in the circuit region. The active regions and gate stacks in the seal ring region are designed and configured differently from those in the circuit regions in terms of dimensions, orientations and other parameters.

Although not intended to be limiting, embodiments of the present disclosure provide one or more of the following advantages. For example, embodiments of the present disclosure provide a seal ring region enclosing a circuit region. The seal ring region includes a sealing region and a transition region between the sealing region and the circuit region. The transition region includes straight conductive lines parallel to an edge of the seal ring region and disposed around the circuit region. The transition region smooths the transition from the circuit region of a higher pattern density to a seal ring region of a low pattern density. Therefore, reducing the over etching or dishing issues during the subsequent processes. In some embodiments, all transition lines in the transition region are parallel to the conductive lines in the circuit region. In some embodiments, each of the transition lines has a width greater than widths of the conductive lines in the circuit region and less than widths of the conductive lines in the seal rings. In some embodiments, first transition lines in the transition region of a first metal layer are substantially perpendicular to second transition lines in the transition region of a second metal layer.

In one example aspect, the present disclosure is directed to a semiconductor structure. The semiconductor structure includes a substrate having a circuit region and a seal ring region around the circuit region; first active regions of a first width $W_1$ formed in the circuit region; second active regions of a second width $W_2$ formed in the seal ring region; first gate stacks disposed on the first active regions in the circuit region and extending to isolation features; and second gate stacks disposed on the second active regions in the seal ring region and completely landing on the second active regions. The second width is greater than the first width, and each of the second active regions is a continuous ring shape to enclose the circuit region.

In another example aspect, the present disclosure is directed to a semiconductor structure. The semiconductor structure includes a substrate having a circuit region and a seal ring region around the circuit region; first active regions disposed in the circuit region; second active regions disposed in the circuit region, wherein each of the second active regions is a continuous ring shape to enclose the circuit region; first gate stacks disposed within the circuit region and configured on the first active regions; and second gate stacks disposed within the seal ring region and configured on the second active regions. The first gate stacks are longitudinally oriented to be orthogonal with the first active regions, and the second gate stacks are longitudinally oriented to be in parallel with the second active regions.

In yet another example aspect, the present disclosure is directed to a semiconductor structure. The semiconductor structure includes a substrate having a circuit region and a seal ring region around the circuit region; first active regions of a first width W1 disposed in the circuit region; second active regions of a second width W2 disposed in the seal ring region; first gate stacks disposed within the circuit region and configured on the first active regions; and second gate stacks disposed within the seal ring region and configured on the second active regions. Each of the second active regions is a continuous ring shape to enclose the circuit region. The first gate stacks are longitudinally oriented to be orthogonal with the first active regions, the second gate stacks are longitudinally oriented to be in parallel with the second active regions, and the second width W2 is greater than the first width.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate having a circuit region and a seal ring region around the circuit region;
   first active regions of a first width W1 formed in the circuit region;
   second active regions of a second width W2 formed in the seal ring region, wherein the second width is greater than the first width, and wherein each of the second active regions is a continuous ring shape to enclose the circuit region;
   isolation features formed in the circuit region and the seal ring region, wherein each of the first and second active regions is surrounded by and separated from other active region by the isolation features, and wherein each of the first and second active regions includes a semiconductor material and is protruded above the isolation features from the substrate;
   first gate stacks disposed on the first active regions in the circuit region and extending to isolation features; and
   second gate stacks disposed on the second active regions in the seal ring region and completely landing on the second active regions, wherein each of the second gate stacks is a continuous ring shape to enclose the circuit region.

2. The semiconductor structure of claim 1, wherein a ratio W2/W1 ranges between 5 and 15.

3. The semiconductor structure of claim 1, wherein the first active regions are configured in parallel and longitudinally oriented along a first direction.

4. The semiconductor structure of claim 3, wherein
   the second active regions include first segments in a first area and second segments in a second area;
   the first segments are longitudinally oriented along the first direction; and
   the second segments are longitudinally oriented along a second direction that is orthogonal to the first direction.

5. The semiconductor structure of claim 4, wherein the second active regions further include third segments in a corner region, the third segment being longitudinally oriented along a third direction different from the first and second directions.

6. The semiconductor structure of claim 5, wherein the third segments of the second active regions connect the first and second segments in the corner region.

7. The semiconductor structure of claim 6, wherein
   the first gate stacks are longitudinally oriented to be orthogonal with the first active regions; and
   the second gate stacks are longitudinally oriented to be in parallel with the second active regions.

8. The semiconductor structure of claim 7, wherein the second gate stacks are landing on the second active region with margins such that a first and second longitudinal edges of each of the second gate stacks are within a first and second longitudinal edges of a corresponding one of the second active regions.

9. The semiconductor structure of claim 8, wherein the second gate stacks include
first gate segments longitudinally oriented along the first direction and landing on the first segments of the second active regions; and
second gate segments longitudinally oriented along the second direction and landing on the second segments of the second active regions.

10. The semiconductor structure of claim 9, wherein the second gate stacks further include third gate segments in the corner region and landing on the third segments of the second active regions, and wherein the third gate segments are longitudinally oriented along the third direction.

11. The semiconductor structure of claim 10, wherein the third gate segments connect the first gate segments and the second gate segments in the corner region.

12. The semiconductor structure of claim 11, wherein the first gate stacks and second gate stacks are different in composition.

13. The semiconductor structure of claim 12, wherein the first gate stacks include a metal material, and the second gate stacks include polysilicon.

14. The semiconductor structure of claim 12, wherein
each of the first active regions includes multiple channels vertically stacked on the substrate;
each of the first gate stacks extends to wrap around a corresponding one of the multiple channels; and
a bottom surface of the second gate stacks is above a top surface of the second active regions.

15. A semiconductor structure, comprising:
a substrate having a circuit region and a seal ring region around the circuit region;
first active regions disposed in the circuit region;
second active regions disposed in the seal ring region, wherein each of the second active regions is a continuous ring shape to enclose the circuit region;
isolation features formed in the circuit region and the seal ring region, wherein each of the first and second active regions is surrounded by and separated from other active region by the isolation features, and wherein each of the first and second active regions includes a semiconductor material and is protruded above the isolation features from the substrate;
first gate stacks disposed within the circuit region and configured on the first active regions; and
second gate stacks disposed within the seal ring region and configured on the second active regions, wherein
the first gate stacks are longitudinally oriented to be orthogonal with the first active regions, and
the second gate stacks are longitudinally oriented to be in parallel with the second active regions.

16. The semiconductor structure of claim 15, wherein
the first active regions include a first width W1; and
the second active regions include a second width W2 being greater than the first width W1, a ratio W2/W1 ranging between 5 and 15.

17. The semiconductor structure of claim 15, wherein
the second active regions include first segments in a first area, second segments in a second area, and third segments in a corner region;
the first segments are longitudinally oriented along a first direction;
the second segments are longitudinally oriented along a second direction that is orthogonal to the first direction; and
the third segments are longitudinally oriented along a third direction different from the first and second directions, the third segments connect the first and second segments.

18. The semiconductor structure of claim 15, wherein
the first gate stacks and second gate stacks are different in composition;
each of the first active regions includes multiple channels vertically stacked on the substrate;
a bottom surface of the first gate stacks is below a bottom surface of a bottommost one of the multiple channels; and
a bottom surface of the second gate stacks is above a top surface of the second active regions.

19. A semiconductor structure, comprising:
a substrate having a circuit region and a seal ring region around the circuit region;
first active regions of a first width W1 disposed in the circuit region;
second active regions of a second width W2 disposed in the seal ring region, wherein each of the second active regions is a continuous ring shape to enclose the circuit region;
first gate stacks disposed within the circuit region and configured on the first active regions; and
second gate stacks disposed within the seal ring region and configured on the second active regions, wherein
the first gate stacks are longitudinally oriented to be orthogonal with the first active regions,
the second gate stacks are longitudinally oriented to be in parallel with the second active regions, and
the second width W2 is greater than the first width W1, wherein the first gate stacks and second gate stacks are different in composition.

20. The semiconductor structure of claim 19, wherein
a ratio W2/W1 ranges between 5 and 15; and
each of the second gate stacks is a continuous ring shape to enclose the circuit region.

* * * * *